(12) United States Patent
Allott

(10) Patent No.: US 6,791,374 B1
(45) Date of Patent: Sep. 14, 2004

(54) ANALOG HOLD CELL IN A CMOS PROCESS

(75) Inventor: Stephen Allott, Scotts Valley, CA (US)

(73) Assignee: Zeevo, Inc., Santa Clara, CA (US)

( * ) Notice: Subject to any disclaimer, the term of this patent is extended or adjusted under 35 U.S.C. 154(b) by 0 days.

(21) Appl. No.: 10/190,129

(22) Filed: Jul. 2, 2002

(51) Int. Cl.$^7$ ............................................. G11C 27/02
(52) U.S. Cl. ........................ 327/94; 327/309; 341/122
(58) Field of Search ................... 327/90, 91, 93–97, 327/309, 312, 560–563; 330/260–261; 341/122–125

(56) References Cited

U.S. PATENT DOCUMENTS

| | | | | |
|---|---|---|---|---|
| 4,105,942 A | * | 8/1978 | Henry | 330/261 |
| 5,471,169 A | * | 11/1995 | Dendinger | 327/563 |
| 5,517,141 A | * | 5/1996 | Abdi et al. | 327/96 |
| 5,734,276 A | * | 3/1998 | Abdi et al. | 327/94 |

* cited by examiner

*Primary Examiner*—Minh Nguyen
(74) *Attorney, Agent, or Firm*—Martine & Penilla, LLP

(57) ABSTRACT

A hold cell implementing a closed-loop, common mode negative feedback method is provided. The hold cell enables generation of an accurate constant output voltage regardless of temperature-dependent leakage currents associated with parasitic diodes and non-ideal devices. The accurate constant output voltage provided by the hold cell is used by the low power oscillator to generate an accurate low frequency output signal. This accurate low frequency output signal is used to maintain long-term timing accuracy in host devices during sleep modes of operation. Incorporation of the hold cell in a low power oscillator is fully implementable in a CMOS process.

13 Claims, 15 Drawing Sheets

ANALOG HOLD CELL IN A CMOS PROCESS

BACKGROUND OF THE INVENTION

1. Field of the Invention

The present invention relates to digital circuit timing accuracy and, more particularly, to techniques for using hold cells in low power oscillators to maintain long-term timing accuracy in sleep mode without reliance on an external crystal.

2. Description of the Related Art

It is common for today's electronic devices to incorporate combinations of analog and digital circuitry. Many of these devices, such as cellular phones, operate in mobile environments where design characteristics are being pushed to meet higher consumer demands. These demands include smaller, more compact devices with longer battery life at a lower overall cost. In order to meet these demands, analog and digital circuitry should be combined more efficiently and in a manner that will reduce power consumption.

In an attempt to conserve power, many devices implement a sleep mode when not in use. It is known, for example, that incorporation of a sleep mode in cellular phone devices may extend battery life by up to a factor of 10. A key objective when designing portable electronic devices is to minimize the amount of current used while in sleep mode. In addition to minimizing the amount of current used while in sleep mode, the device should also be able to retain some level of timing accuracy for a minimum duration as dictated by the application.

To maintain the required level of timing accuracy while in sleep mode, most devices use a sleep mode oscillator. It is common in modem designs to use a low-power, low-frequency crystal on the printed circuit board for the sleep mode oscillator. This low-power crystal is external to the semiconductor chips and is present in addition to an external master crystal which is used during normal operation.

FIG. 1, while not to scale, shows a prior art printed circuit board (PCB) device 101, including a semiconductor chip 103, an external master crystal 115, and an external low-power crystal 117. The semiconductor chip 103 may contain a digital core 105, an analog component 107, a digital component 109, a radio frequency (RF) component 111, or other circuitry 113. The semiconductor chip 103 receives a signal 119 from either the master crystal 115 or the low-power crystal 117, depending on the mode of operation.

The use of the second external low-power crystal 117 presents several disadvantages relative to design optimization. An obvious disadvantage is that the second external low-power crystal 117 takes up valuable space on the PCB device 101. FIG. 1 is not to scale; in actuality the external master crystal 115 and external low-power crystal 117 are of relatively large size, comparable to the size of the semiconductor chip 103 itself. Therefore, addition of the second external low-power crystal 117 can be significant to overall PCB device 101 size. Another disadvantage is that adding the second external low-power crystal 117 increases the expense of the overall PCB device 101. A less obvious disadvantage is that the external low-power crystal 117 requires the semiconductor chip 103 to have a pin available for interface connection. As the semiconductor chip 103 has a limited number of pins available, dedication of a pin to the external low-power crystal 117 may be costly relative to design restrictions and complications. Furthermore, the routing required to connect the semiconductor chip 103 to the external low-power crystal 117 uses valuable PCB device 101 area and adds expense. Two objectives in the industry are to move toward smaller devices and minimize cost. Adding the second external low-power crystal 117 to the PCB device 101 does not comply with these two objectives. Therefore, the focus of attention is to remove the external low-power crystal 117 used to support the sleep mode of operation.

FIG. 2 shows the PCB device 101 from FIG. 1 with the external low-power crystal 117 removed. Additionally, FIG. 2 shows a low power oscillator (LPO) 121 receiving a clock reference signal 123 from the external master crystal 115 and providing a low frequency output signal 125 to the digital core 105. As a substitute for the external low-power crystal 117, one requirement of the LPO 121 is to derive a lower frequency signal from a higher frequency signal. The temperature stability of the LPO 121 is a typical consideration when replacing the external low-power crystal 117. A feature of an on-board crystal is that changes in frequency due to changes in temperature are minimized, whereas a free-running oscillator will change in frequency significantly with temperature. However, one known method for designing the LPO 121 to be temperature stable is to use a conventional phase lock loop (PLL) 122, as shown in FIG. 3.

FIG. 3 shows the conventional PLL 122 used to derive a lower frequency signal from a higher frequency signal. The conventional PLL 122 takes an accurate clock reference signal 123 from the external master crystal 115. The clock reference signal 123 is passed to a reference divider 129, via a connection 127, which divides the clock reference signal 123 down to a lower frequency signal. The output signal from the reference divider 129 is then passed to a phase frequency detector (PFD) 133 via a connection 131. The PFD 133 generates an output signal which is passed through a connection 135 to control a charge pump 137. The charge pump 137, in turn provides an output signal which is passed through a connection 139 to control a voltage controlled oscillator (VCO) 145. The VCO 145 provides a low frequency output signal 125 from the conventional PLL 122 via a connection 146. The VCO 145 low frequency output signal 125 is also passed to an N-counter 149, via a connection 147. The N-counter 149 generates an output signal which is provided to the PFD 133 via a connection 151. An N value of the N-counter 149 can be set arbitrarily; however, the N value remains fixed. Due to the conventional PLL 122 functionality, the VCO 145 output frequency is equal to the N value of the N-counter 149 times the N-counter 149 output frequency. The conventional PLL 122 function is to make both input signals to the PFD 133 match in both frequency and phase. The PFD 133 makes a decision on whether or not the VCO 145 output signal frequency should be higher or lower, depending on what is required to match the reference input signal frequency, received through connection 131, to the N-counter 149 output signal frequency received through connection 151. Thus, the conventional PLL 122 is a closed-loop, negative feedback circuit.

Due to the way the PFD 133 functions and the accuracy of the clock reference signal 123 entering the PFD 133 via the reference divider 129, the accuracy of the VCO 145 low frequency output signal 125 will equal the accuracy of the clock reference signal 123. Therefore, obtaining a desired low frequency output signal 125 accuracy is accomplished by requiring the clock reference signal 123 to have a better accuracy. In reality, external master crystal 115 accuracies are typically ±20 ppm which is sufficient for LPO 121 applications requiring output signal accuracies up to ±20 ppm.

Through use of the conventional PLL 122 featuring closed-loop, negative feedback, the consistent low frequency output signal 125 is derived from the clock reference signal 123 and is maintained regardless of changes in temperature. Thus, the closed-loop, negative feedback conventional PLL 122 alleviates the need for the additional external low-power crystal 117 to produce a low frequency reference clock signal to be used in sleep mode. However, power conservation while in sleep mode requires that the external master crystal 115 be turned off.

One feature of the conventional PLL 122 is that it has a flywheel effect. This means that once the loop is locked, if the loop is broken, the output of the VCO 145 will stay at the same frequency for a short period of time. This stems from the fact that as long as a voltage V, as shown in FIG. 3, at the input to the VCO 145 remains constant, the output frequency from the VCO 145 will remain constant. To take advantage of the conventional PLL 122 flywheel effect when the master crystal 115 is turned off, such as when entering sleep mode, the input voltage to the VCO 145 should be maintained at a constant level.

FIG. 4 shows the conventional PLL 122 in an opened state where the clock reference signal 123, the reference divider 129, the PFD 133, the charge pump 137, and the N-counter 149 are turned off as indicated by a slash 153. As shown in FIGS. 3, 4, and 5, the conventional PLL 122 incorporates a loop filter 144 at input connection 139 to the VCO 145. The loop filter 144 includes a resistor 141 coupled to a capacitor 143. The coupling of resistor 141 and capacitor 143 serves to stabilize the input voltage V to the VCO 145. Opening of the conventional PLL 122 may be thought of as a switch 155, as shown in FIG. 5, to the input of the VCO 145.

FIG. 5 shows the circuit diagram of the conventional PLL 122 between the charge pump 137 and the VCO 145. Switch 155 is in line with connection 139 which provides input to the VCO 145. The coupled resistor 141 and capacitor 143 are in line with the input to the VCO 145 to facilitate maintaining a constant VCO 145 input voltage V. If the switch 155 were considered ideal and the voltage V at the input to the VCO 145 were to remain constant, the frequency of the low frequency output signal 125 would remain constant. Unfortunately, due to tolerances and imperfections in the complementary metal oxide silicon (CMOS) process used to make semiconductor chips, a leakage current $I_1$ 159 and a leakage current $I_2$ 161 flow from the capacitor 143 through parasitic P-N junction diodes on the silicon. Also, leakage currents flowing through parasitic P-N junction diodes within the VCO 145 are symbolized by the presence of a diode 157 in FIG. 5. Thus, the presence of leakage current is simply due to the nature of the CMOS process used to create semiconductor chips.

Even though leakage currents through the parasitic P-N junction diodes are very small, they can have a significant effect on the voltage V at the input to the VCO 145. The high sensitivity of the VCO 145 input voltage V to leakage currents $I_1$ 159 and $I_2$ 161 is partially due to the high impedance present when looking through a node 140 toward the entrance of the VCO 145 and back toward the switch 155. Furthermore, due to the high gain (i.e., Hz/V) of a typical VCO 145, a small change in current may cause a change in the VCO 145 input voltage V sufficiently large to in turn cause the VCO 145 output frequency to fall outside of an acceptable range. For example a typical VCO 145 may have a gain of 20 kHz per Volt. If this typical VCO 145 requires an output frequency accuracy of ±4 Hz, a change in VCO 145 input voltage V of more than 0.2 mV will cause the VCO 145 output frequency to be unacceptable. The time required for the leakage currents $I_1$ 159 and $I_2$ 161 to cause an unacceptably large change in VCO 145 input voltage V is typically very short (i.e., less than one second). This basically means that a device using a conventional PLL 122 would be required to return from sleep mode quite frequently (i.e., about every second or less) despite the absence of a user operation signal. If the device has sufficient computing capability and battery life, a frequency hold time (i.e., sleep mode duration) of less than one second may be tolerable. However, for small mobile devices that are limited in computing power by variables such as cost, size, and power consumption, it is desirable to have the capability of maintaining longer sleep mode operation times (i.e., longer VCO 145 input voltage V hold times).

In view of the foregoing, there is a need for a device that avoids the problems of the prior art by providing a temperature-stable, low power consumption, CMOS process implementable, size-efficient method for generating an accurate reference clock signal that can be used to support long sleep mode operation times in systems where optimization of size, cost, and battery life are paramount.

SUMMARY OF THE INVENTION

Broadly speaking, the present invention fills these needs by providing methods and apparatuses for an analog hold cell that can be used in a low power oscillator to generate an accurate reference clock signal to support a long sleep mode operation time in an electronic device. It should be appreciated that the present invention can be implemented in numerous ways, including as a process, an apparatus, a system, a device, or a method. Several embodiments of the present invention are described below.

In one embodiment, a low power oscillator is disclosed. The low power oscillator includes a voltage controlled oscillator having an input and an output. The output of the voltage controlled oscillator provides a signal of substantially constant frequency that can be used by a host electronic device during a sleep mode (i.e., low-power mode) of operation. During the sleep mode of operation, the voltage controlled oscillator receives its input from a hold cell. The hold cell provides a differential voltage as the input to the voltage controlled oscillator. The hold cell incorporates a common mode voltage feedback to control a common mode voltage associated with the differential input voltage supplied to the voltage controlled oscillator. The common mode voltage feedback control assists in maintaining the differential input voltage supplied to the voltage controlled oscillator at a substantially constant level. Thus, allowing the voltage controlled oscillator to generate an output signal of substantially constant frequency during low-power operation of the host electronic device.

In another embodiment, a hold cell is disclosed. The hold cell includes hold circuitry that provides a differential output voltage. The hold circuitry is in electrical communication with control circuitry. The control circuitry receives a common mode voltage from the hold circuitry and compares the common mode voltage to a reference voltage. A difference between the common mode voltage and the reference voltage is used by the control circuitry to generate a feedback signal that is sent from the control circuitry to variable current source circuitry. The variable current source circuitry provides a current to the hold circuitry based on the feedback signal received from the control circuitry. The current provided from the variable current source circuitry to the hold circuitry is used to adjust the common mode voltage provided by the hold circuitry such that the difference between the common mode voltage and the reference voltage is negated.

In yet another embodiment, a method for providing a substantially constant differential voltage is disclosed. The method includes storing a voltage on a first hold stage and a second hold stage. A differential output voltage is then generated by the first hold stage. The method further includes refreshing the voltage stored on the second hold stage with the voltage stored on the first hold stage. The differential output voltage previously generated by the first hold stage is replaced with a differential output voltage generated by the second hold stage. The method further includes refreshing the voltage stored on the first hold stage with the voltage stored on the second hold stage. The differential output voltage previously generated by the second hold stage is then replaced with a differential output voltage generated by the first hold stage. Refreshing of the voltages on the first and second hold stages and the alternation of the differential output voltage generation responsibility between the first and second hold stages continues in the aforementioned manner until a signal requires the method to revert back to storing a voltage on the first hold stage and the second hold stage. While performing the method, the generated differential output voltage remains substantially constant.

The advantages of the present invention are numerous. The hold cell incorporated into a low power oscillator as disclosed in the present invention provides a device and method for generating an accurate reference clock signal. The accurate reference clock signal can be used to support long sleep mode operation times. Furthermore, the present invention avoids the problems of the prior art by providing a temperature-stable, low power consumption, CMOS process implementable, size-efficient method for generating the accurate reference clock signal. Thus, the advantages of the present invention are especially useful in systems where optimization of size, cost, and battery life are paramount.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a hold cell that may be incorporated into a low power oscillator. The hold cell of the present invention successfully implements a closed-loop, common mode negative feedback method that enables generation of an accurate constant output voltage regardless of temperature-dependent leakage currents associated with parasitic diodes and non-ideal devices. The accurate constant output voltage provided by the hold cell may be used by the low power oscillator to generate an accurate low frequency output signal. This accurate low frequency output signal may be used to maintain long-term timing accuracy in host devices during sleep modes of operation when an external crystal is not available to provide a clock signal. Further, incorporation of the hold cell in the low power oscillator is fully implementable in a CMOS process. Therefore, the hold cell incorporated into a low power oscillator as disclosed in the present invention avoids the problems of the prior art by providing a temperature-stable, low power consumption, CMOS process implementable, size-efficient method for generating an accurate reference clock signal that can be used to support long sleep mode operation times in systems where optimization of size, cost, and battery life are paramount.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
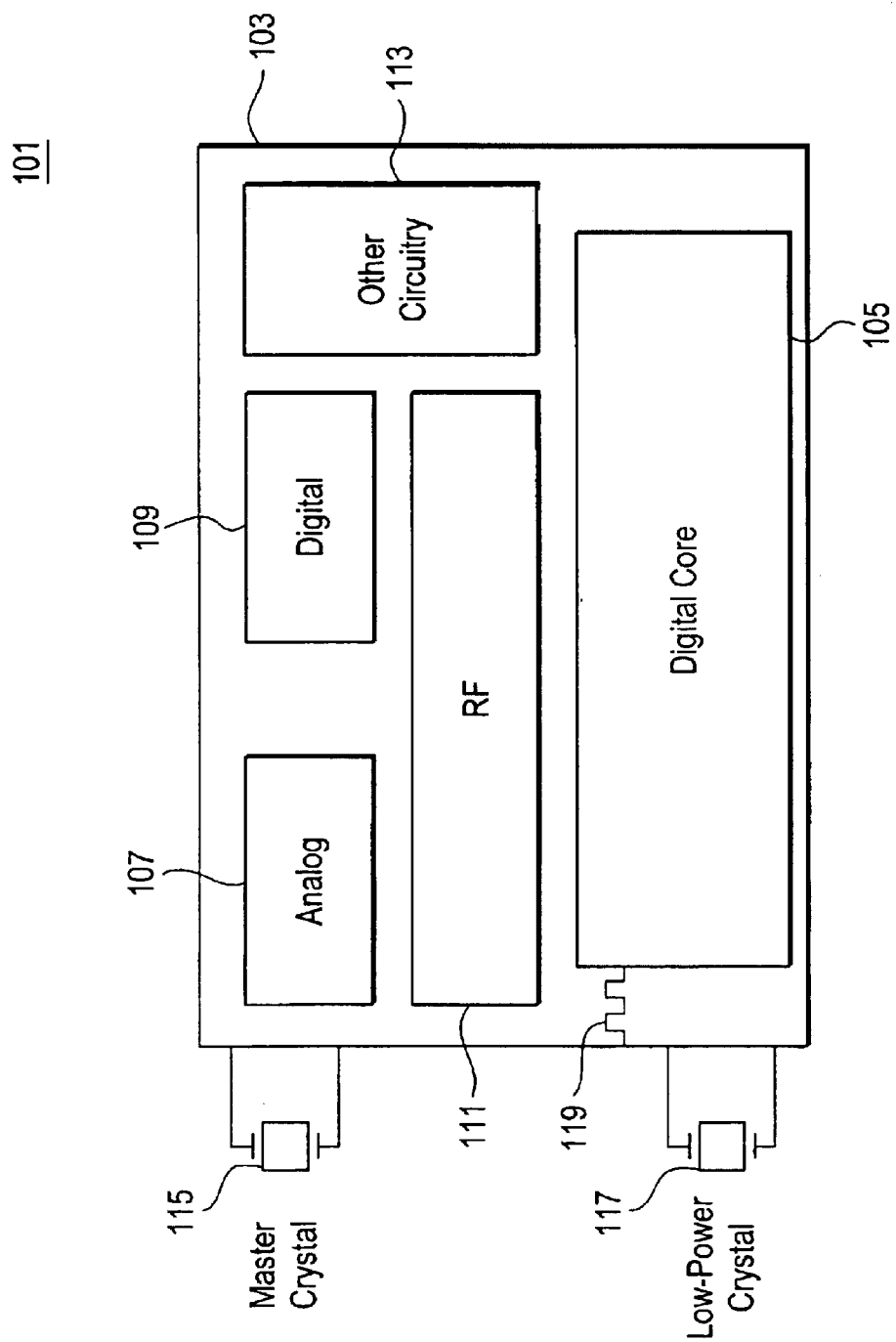
FIG. 1 is an illustration showing a prior art printed circuit board device including a semiconductor chip, an external master crystal, and an external low-power crystal.
Figure 2:
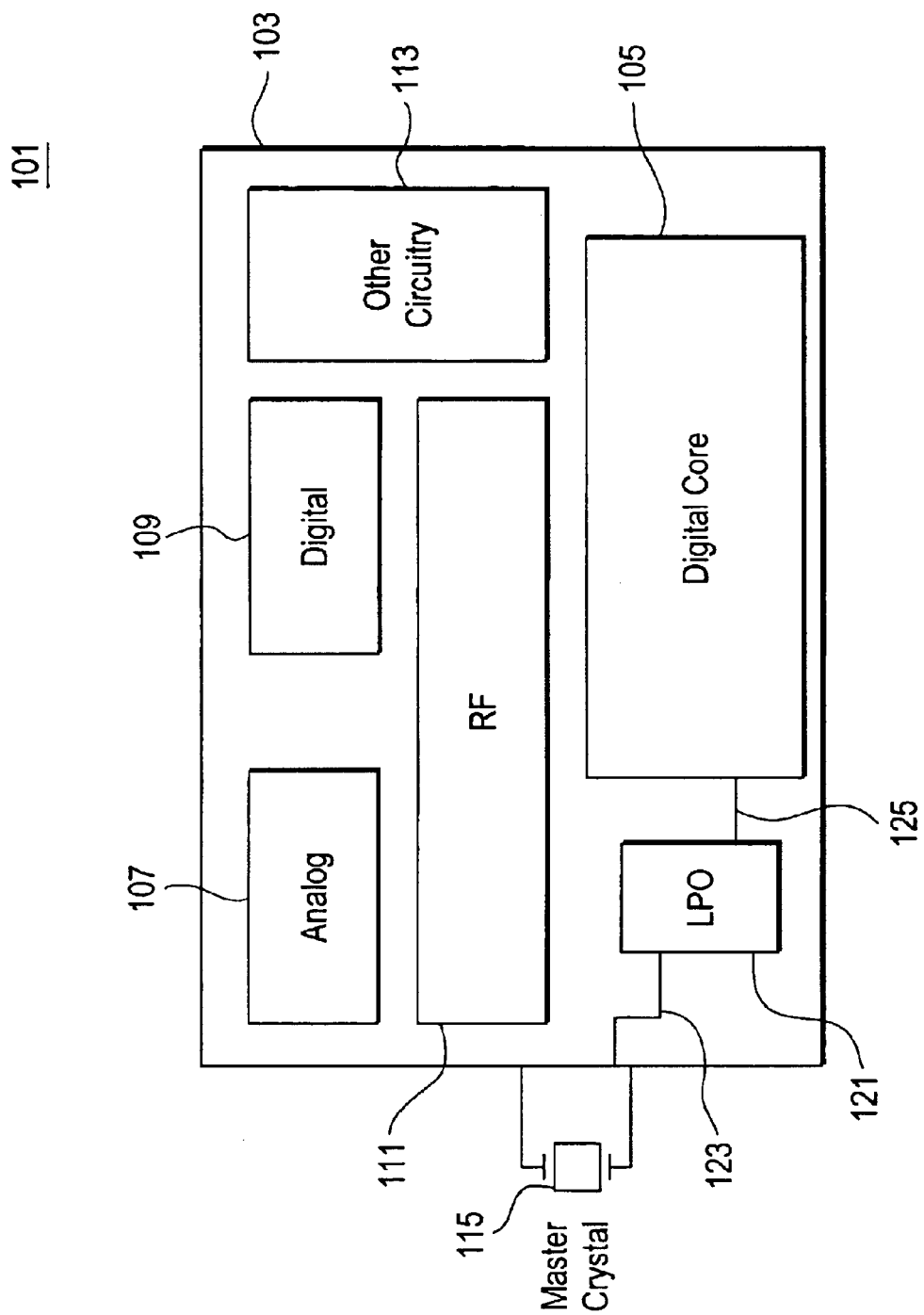
FIG. 2 is an illustration showing a prior art printed circuit board device with the external low-power crystal removed.
Figure 3:
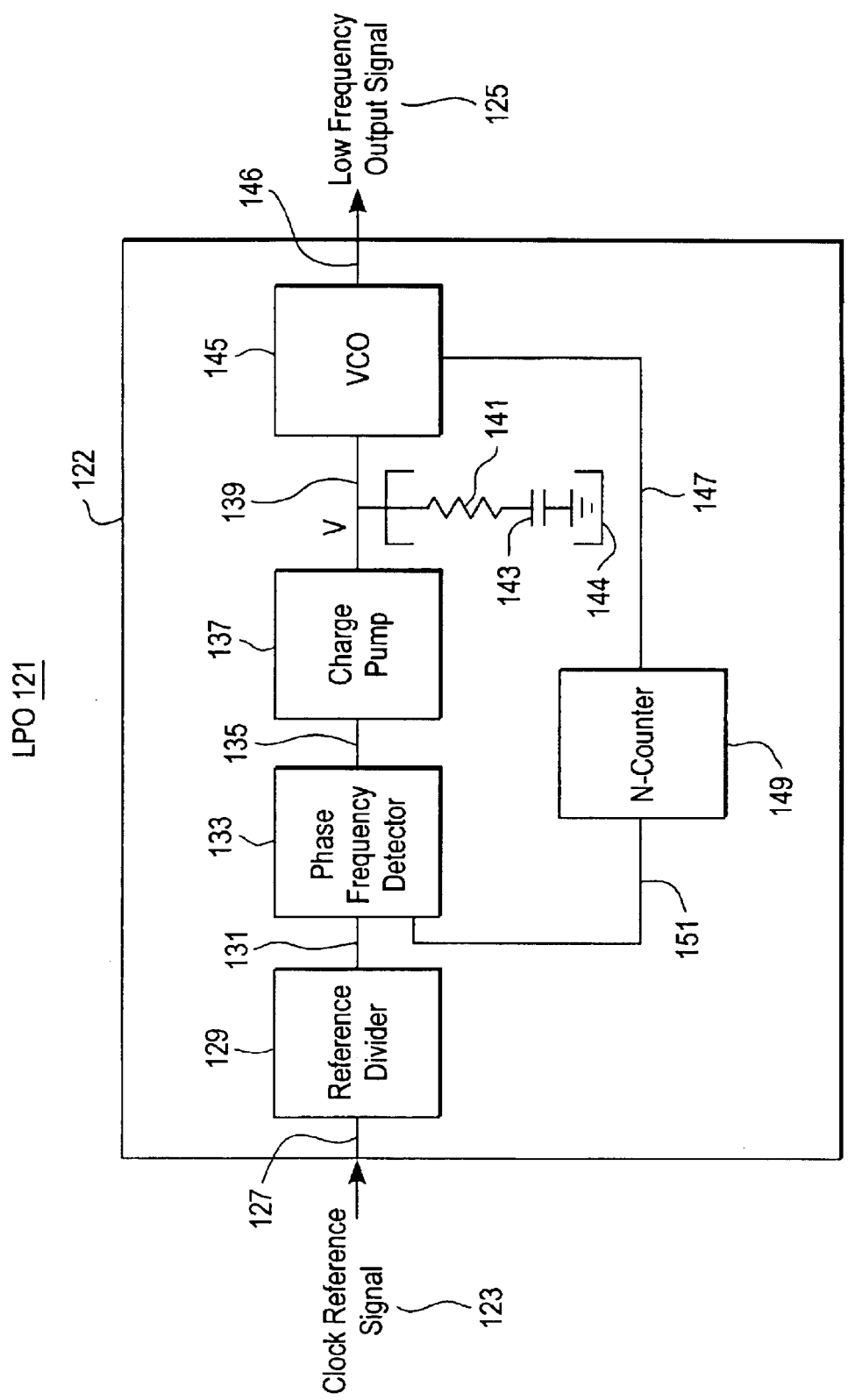
FIG. 3 is an illustration showing a prior art conventional phase lock loop used to derive a low frequency output signal from a clock reference signal.
Figure 4:
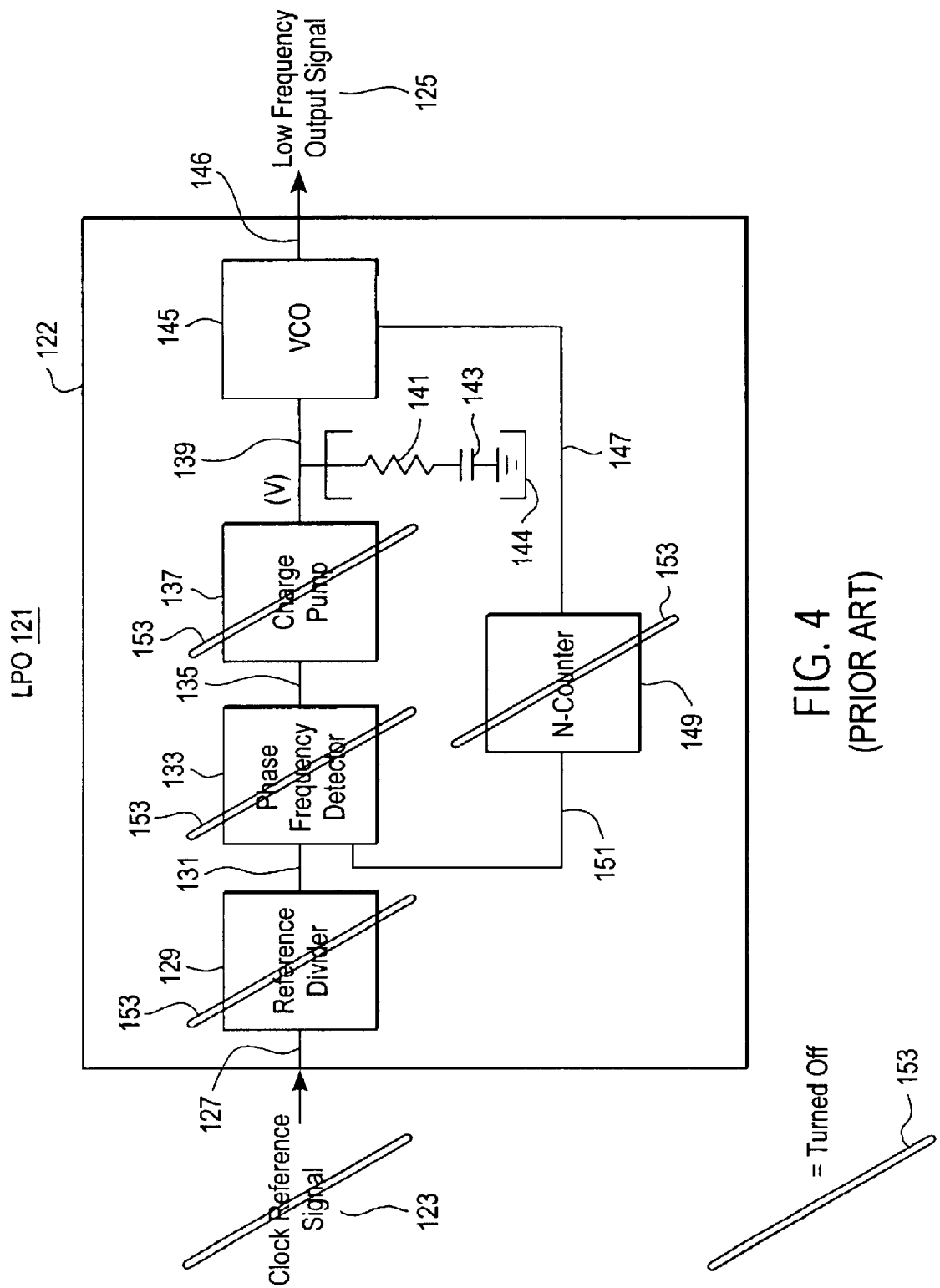
FIG. 4 is an illustration showing a prior art conventional phase lock loop in an open state where the clock reference signal, the reference divider, the phase frequency detector, the charge pump, and the N-counter are turned off.
Figure 5:
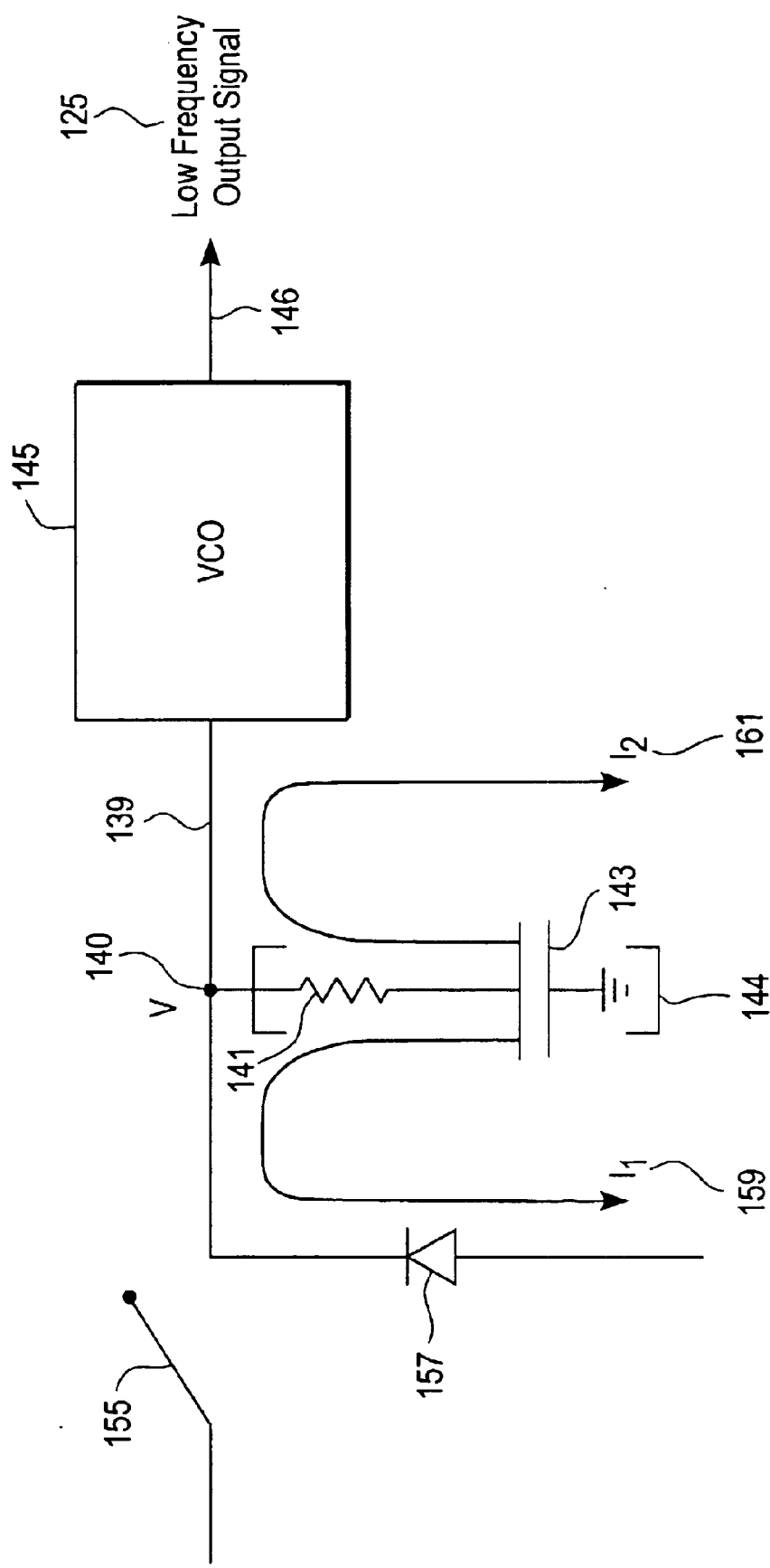
FIG. 5 is an illustration showing the circuit diagram of a prior art conventional phase lock loop between the charge pump and the voltage controlled oscillator.
Figure 6:
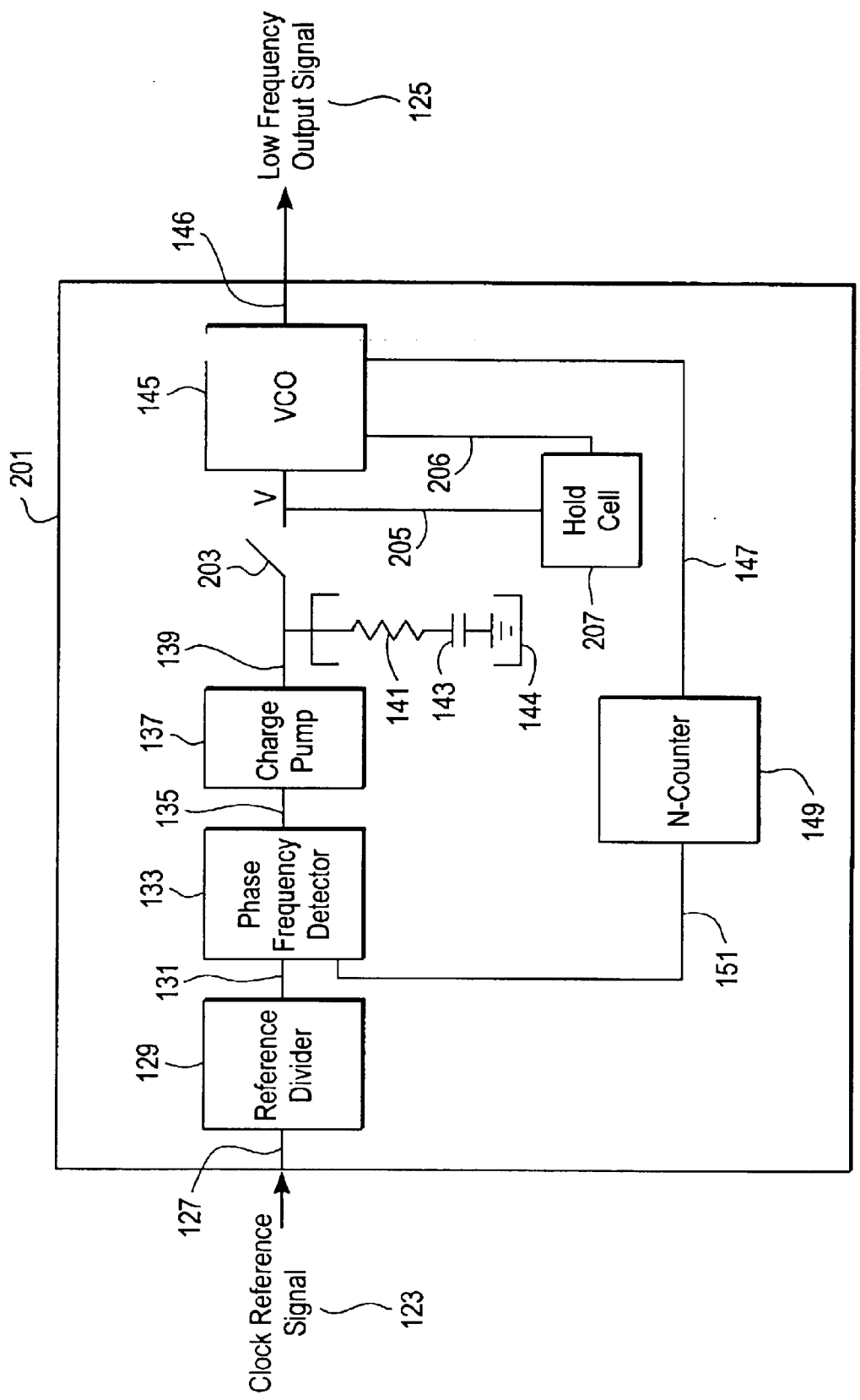
FIG. 6 is an illustration showing a modified phase lock loop that uses a hold cell in accordance with one embodiment of the present invention.

FIG. 6 shows a modified phase lock loop (PLL) 201 that uses a hold cell 207, in accordance with one embodiment of the present invention. The modified PLL 201 derives a low frequency output signal 125 from a clock reference signal 123. The modified PLL 201 accepts the clock reference signal 123 which is passed to a reference divider 129 via a connection 127. The reference divider 129 divides the clock reference signal 123 down to a lower frequency signal. In a preferred embodiment of the present invention, the reference divider 129 receives a 12 MHz input signal and divides it down to an output signal of approximately 8 kHz. The output signal from the reference divider 129 is then passed to a phase frequency detector (PFD) 133 via a connection 131. The PFD 133 generates an output signal which is passed through a connection 135 to control a charge pump 137. In a preferred embodiment, one charge pump may be used. However, in another embodiment two or more charge pumps may be used depending on the requirements of the application. The charge pump 137, provides an output signal which is passed through a connection 139 to control a voltage controlled oscillator (VCO) 145. The VCO 145 generates the low frequency output signal 125 which is output from the modified PLL 201 through a connection 146. The low frequency output signal 125 generated by the VCO 145 is also passed to an N-counter 149 via a connection 147. The N-counter 149 generates an output signal which is provided to the PFD 133 via a connection 151. A resistor 141 is coupled to a capacitor 143 at connection 139 between the charge pump 137 and the VCO 145 to form a loop filter 144 that assists in maintaining a differential input voltage V to the VCO 145. Also, the hold cell 207 is configured in the modified PLL 201 to sample the differential input voltage V to the VCO 145 through a connection 205. The hold cell 207 in turn provides the differential input voltage V to the VCO 145 through a connection 206 when a switch 203 is opened. The switch 203 is provided along the connection 139 to allow the VCO 145 and hold cell 207 to be isolated from the remainder of the modified PLL 201 in the absence of the clock reference signal 123. The switch 203 may be implemented in any manner so long as current is prevented from flowing to the VCO 145 and the hold cell 207 from the charge pump 137.

An N value of the N-counter 149 can be set arbitrarily; however, the N value remains fixed. Due to the modified PLL 201 functionality, the VCO 145 output frequency is equal to the N value of the N-counter 149 times the N-counter 149 output frequency. In a preferred embodiment of the present invention, the N value is set to 4 and the output frequency of the N-counter is 8 kHz, thus resulting in a VCO 145 output frequency of 32 kHz. The modified PLL 201 function is to make both input signals to the PFD 133 match in both frequency and phase. The PFD 133 makes a decision on whether or not the VCO 145 output signal frequency should be higher or lower, depending on what is required to match the reference input signal frequency, received via connection 131, to the N-counter 149 output signal frequency received via connection 151. Therefore, the modified PLL 201 is a closed-loop, negative feedback circuit.

Due to the way the PFD 133 functions and the accuracy of the clock reference signal 123 entering the PFD 133 via the reference divider 129, the accuracy of the VCO 145 low frequency output signal 125 will equal the accuracy of the clock reference signal 123. Therefore, obtaining a desired low frequency output signal 125 accuracy is accomplished by requiring that the clock reference signal 123 have a better accuracy. In a preferred embodiment of the present invention, the clock reference signal 123 has an accuracy of less than 250 parts per million (ppm) so that the low frequency output signal 125 has an accuracy of at least ±250 ppm.

The closed-loop, negative feedback behavior of the modified PLL 201 serves to maintain the low frequency output signal 125 from the VCO 145 at a substantially constant frequency. However, the VCO 145 low frequency output signal 125 can only be maintained at a substantially constant frequency if the differential input voltage V to the VCO 145 is maintained at a substantially constant level. During normal mode operation of a host device (e.g., cell phone or any other portable electronic device), the switch 203 is closed such that the coupling of resistor 141 and capacitor 143 serves to stabilize the differential input voltage V to the VCO 145. Conversely, during sleep mode operation of a host device, the clock reference signal 123 is absent and the switch 203 is opened such that the hold cell 207 provides the differential input voltage V to the VCO 145.

Unlike the conventional PLL 122 in the prior art, the modified PLL 201 incorporates the hold cell 207 to provide a steady differential input voltage V to the VCO 145 when the host device is in a sleep mode of operation. During the normal operation mode of the host device, both the VCO 145 and the hold cell 207 receive their input voltages from the charge pump 137. Also, during normal operation mode, the differential input voltage V to the VCO 145 is stabilized by the loop filter 144 along connection 139. In a preferred embodiment, when the host device enters a sleep mode of operation, the clock reference signal 123, reference divider 129, PFD 133, charge pump 137, and N-counter 149 are all turned off. In the absence of hold cell 207, the coupled resistor 141 and capacitor 143 of the loop filter 144 are required to maintain the differential input voltage V to the VCO 145. Due to leakage currents flowing through parasitic diodes within the resistor 141, capacitor 143, and VCO 145 circuitry, the coupled resistor 141 and capacitor 143 cannot maintain the differential input voltage V to the VCO 145. Therefore, in a preferred embodiment, the switch 203 and hold cell 207 are implemented such that leakage currents passing through parasitic diodes associated with resistor 141 and capacitor 143 cannot affect the differential input voltage V to the VCO 145. Upon opening the switch 203, the hold cell 207 serves to provide the steady differential input voltage V to the VCO 145. The hold cell 207 incorporates a dynamic common mode voltage control method that allows the differential input voltage V to the VCO 145 to be maintained at an accuracy that is not dependent on leakage currents resulting from implementation of the modified PLL 201 circuitry in a complementary metal oxide silicon (CMOS) process.

FIG. 6 shows the connection 139 as a single-ended voltage at the output of the charge pump 137, but in actual implementation the charge pump 137 provides separate positive and negative output voltages. Both the hold cell 207 and VCO 145 operate based on a differential voltage. For example, if a differential input voltage of 200 mV were required by the VCO 145, the charge pump may provide a positive output voltage of 1.1 V and a negative output voltage of 0.9 V. As long as the differential input voltage V to the VCO 145 remains substantially constant, the low frequency output signal 125 generated by the VCO 145 will remain substantially constant. Therefore, it is the objective of the hold cell 207 to provide a substantially constant output differential voltage. To support this objective, the hold cell 207 is designed to operate in a common mode manner based on a common mode voltage.

A useful characteristic of the hold cell 207 operating in common mode manner is that any associated leakage current will also behave in a common mode manner. Thus, leakage currents flowing through a positive or a negative terminal will be the same such that the corresponding differential voltage signal will not be affected. Therefore, the hold cell 207 should operate in a common mode range for the differential voltage output signal to remain unaffected. The common mode range is defined by a range of common mode voltage over which a transistor of the hold cell 207 will function properly. Hold cells of the prior art suffer significantly from leakage current, particular with increased temperature, such that the time required for the common mode voltage to move outside of the common mode voltage range is very short (e.g., on the order of hundreds of milliseconds for a typical hold cell of the prior art). The hold cell 207 of the present invention operates using a dynamic common mode voltage control method that allows the hold cell 207 to remain within common mode range for an extended period of time. In a preferred embodiment of the present invention, the hold cell 207 is capable of operating in common mode range for up to 41 seconds. In another embodiment, the hold cell 207 may be capable of operating in common mode range for more than 41 seconds. To implement the dynamic common mode voltage control method, the hold cell 207 uses a common mode feedback technique and three modes of operation: 1) a sampling mode, 2) a hold mode, and 3) a refresh mode.

Figure 7:
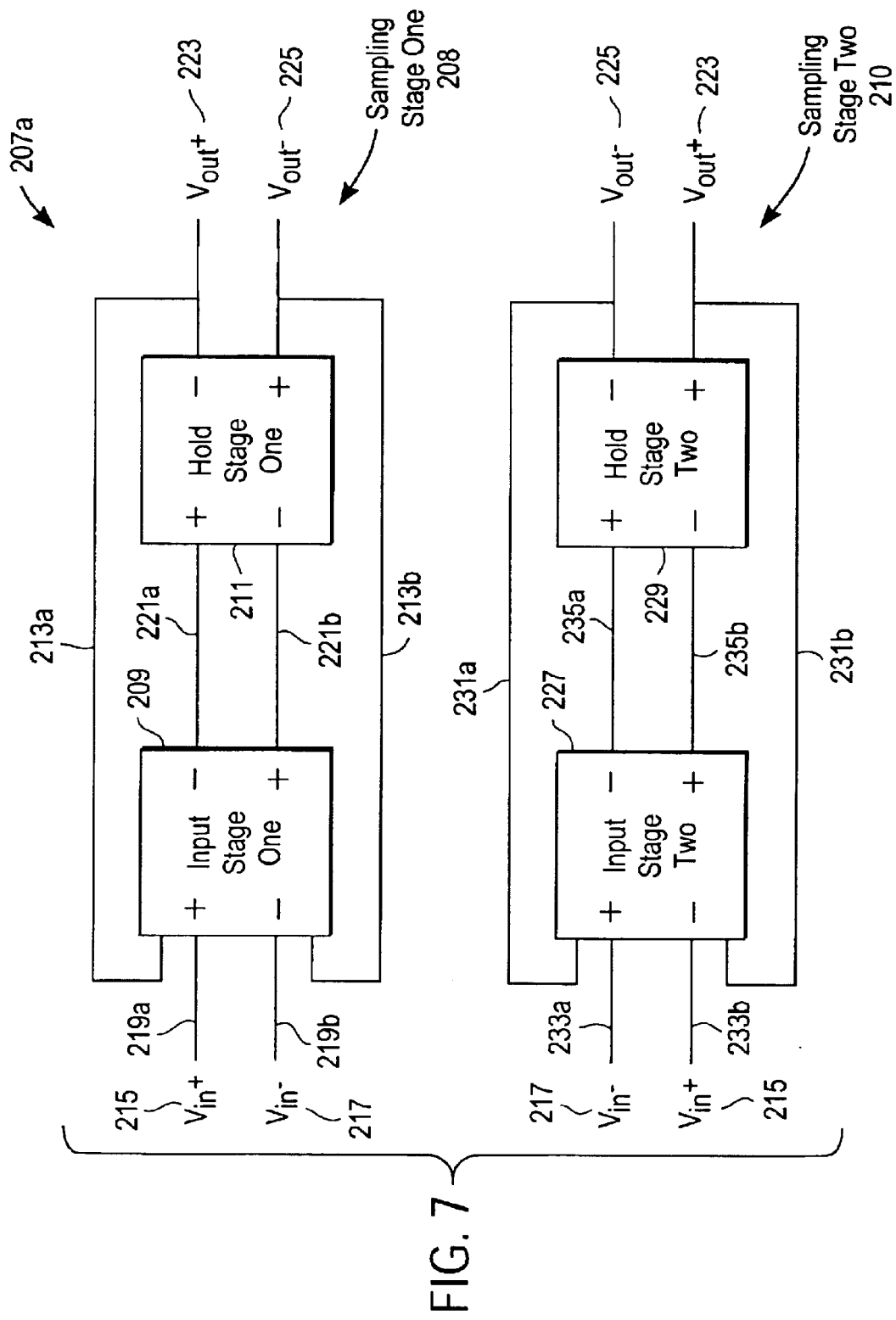
FIG. 7 is an illustration showing a hold cell in a sampling mode of operation in accordance with one embodiment of the present invention.

FIG. 7 shows the hold cell 207 in a sampling mode of operation 207a, in accordance with one embodiment of the present invention. The sampling mode of operation 207a includes a sampling stage one 208 and a sampling stage two 210. In sampling stage one 208, a positive input voltage $V_{in}+$ 215 and a negative input voltage $V_{in}-$ 217 are provided through a connection 219a and a connection 219b, respectively, to an input stage one 209. In a preferred embodiment of the present invention, input stage one 209 may be a type of transconductance amplifier or equivalent device. In an another embodiment, input stage one 209 may be a type of operational amplifier or equivalent device. The output from input stage one 209 is provided to a hold stage one 211 through a connection 221a and a connection 221b. In a preferred embodiment, hold stage one may be a capacitor or equivalent device. Feedback signals are provided to input stage one 209 from hold stage one 211 through a connection 213a and a connection 213b. A positive output voltage $V_{out}+$ 223 and a negative output voltage $V_{out}-$ 225 are available from hold stage one 211 through the connections 213a and 213b, respectively.

Sampling stage two 210 operates in a manner very similar to sampling stage one 208. Sampling stage two 210 includes an input stage two 227 and a hold stage two 229, which are identical in structure to input stage one 209 and hold stage one 211, respectively. Input stage two 227 accepts input voltages $V_{in}-$ 217 and $V_{in}+$ 215 through a connection 233a and a connection 233b, respectively. In sampling stage two 210 the input voltages $V_{in}+$ 215 and $V_{in}-$ 217 are sampled in reverse polarity with respect to sampling stage one 208. The output from input stage two 227 is provided to hold stage two 229 through a connection 235a and a connection 235b. Feedback signals are provided to input stage two 227 from hold stage two 229 through a connection 231a and a connection 231b. The output voltages $V_{out}-$ 225 and $V_{out}+$ 223 are available from hold stage two 229 through the connections 231a and 231b, respectively.

The hold cell 207 operates in the sampling mode of operation 207a during normal operation of the host device when the switch 203 is closed and the modified PLL 201 is receiving the clock reference signal 123. In the sampling mode of operation 207a, input voltage signals $V_{in}+$ 215 and $V_{in}-$ 217 as received from charge pump 137 are sampled onto hold stage one 211 in sampling stage one 208 and onto hold stage two 229 in sampling stage two 210. The concept is to have negative feedback going from hold stage one 211 to input stage one 209, such that $V_{out}+$ 223 and $V_{out}-$ 225 accurately represent $V_{in}+$ 215 and $V_{in}-$ 217 with the exception of a possible DC offset associated with input stage one 209. Similarly, negative feedback goes from hold stage two 229 to input stage two 227, such that $V_{out}+$ 223 and $V_{out}-$ 225 accurately represent $V_{in}+$ 215 and $V_{in}-$ 217 with the exception of a possible DC offset associated with input stage two 227. Therefore, sampling stage one 208 and sampling stage two 210 hold essentially the same output voltages but in opposite polarity. The purpose of having sampling stage two 210 is to allow implementation of a correlated double sampling technique for mitigating DC offsets in the hold cell 207. The benefits of the correlated double sampling technique are actually realized during the refresh mode of operation.

Figure 8:
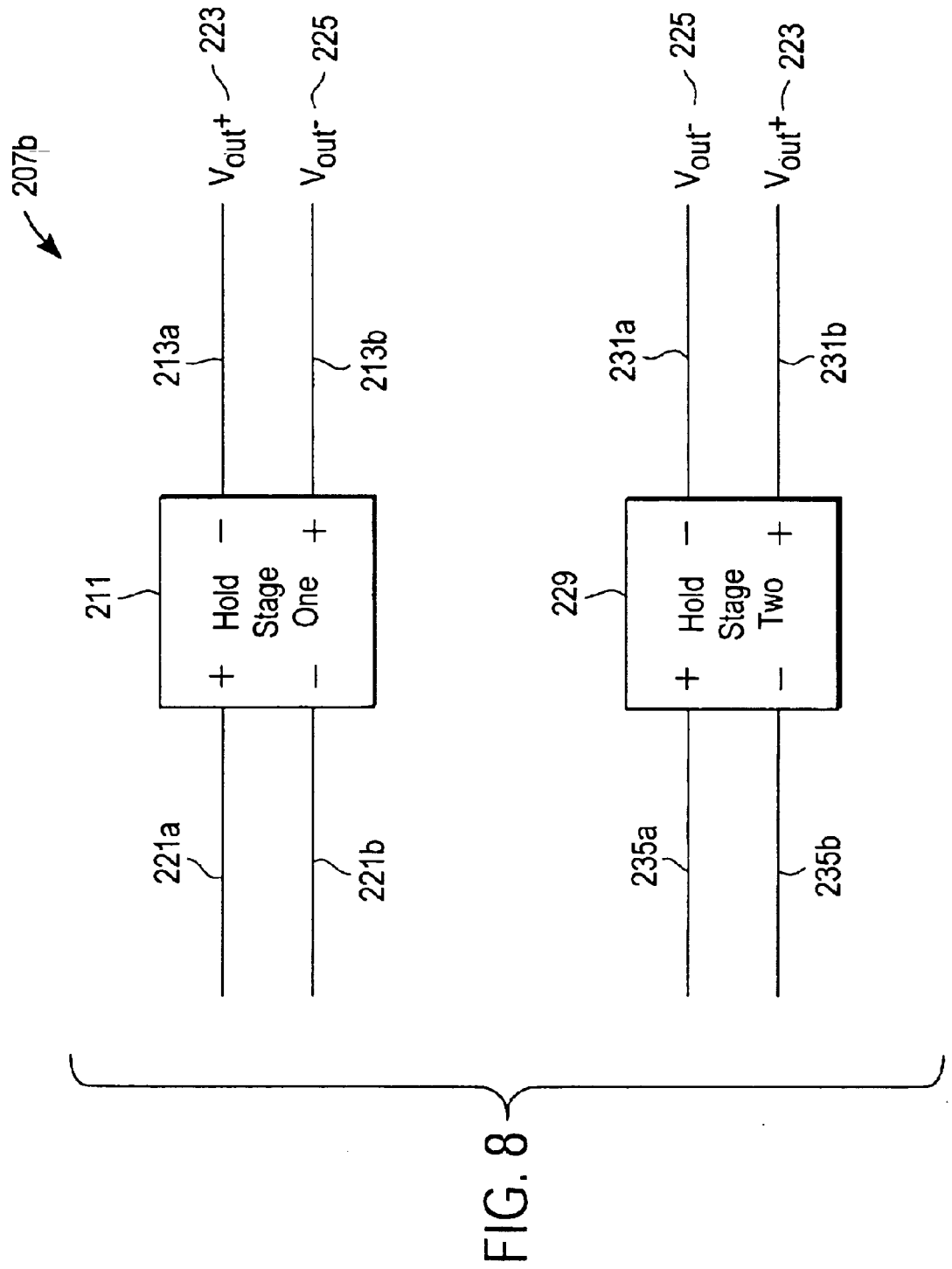
FIG. 8 is an illustration showing a hold cell in a hold mode of operation in accordance with one embodiment of the present invention.

The hold cell 207 operates in the sampling mode of operation 207a until the host device decides to enter a sleep mode. At such time, the hold cell 207 switches to a hold mode of operation 207b and accepts the responsibility of providing the differential input voltage V to the VCO 145. FIG. 8 shows the hold cell 207 in the hold mode of operation 207b, in accordance with one embodiment of the present invention. The hold mode of operation 207b includes hold stage one 211 and hold stage two 229. In the hold mode of operation 207b, input stage one 209 and input stage two 227, as shown in FIG. 7, are disconnected from hold stage one 211 and hold stage two 229, respectively. This disconnection is indicated by the open ends of connections 221a, 221b, 235a, and 235b. Also, the connections 213a, 213b, 231a, and 231b which provide feedback to input stage one 209 and input stage two 227, as shown in FIG. 7, have been disconnected. The output voltages $V_{out}+$ 223 and $V_{out}-$ 225 are obtained from hold stage one 211 through connections 213a and 213b, respectively. Also, the output voltages $V_{out}-$ 225 and $V_{out}+$ 223 are obtained from hold stage two 229 through connections 231a and 231b, respectively.

In the hold mode of operation 207b, input stage one 209 and input stage two 227 (collectively called the input stages) are essentially disconnected from hold stage one 211 and hold stage two 229 (collectively called the hold stages), respectively. With these disconnections, reliance is placed on the hold stages to maintain $V_{out}+$ 223 and $V_{out}-$ 225 which are used to provide the differential input voltage V to the VCO 145. Once the input stages are disconnected from the hold stages, leakage currents may cause the voltages on the input of the hold stages to begin to drop in common mode. While the voltages on the input of the hold stages remain in common mode range, the differential output voltage V will remain essentially constant. However, when the voltages on the input of the hold stages fall out of common mode range, the output voltages $V_{out}+$ 223 and $V_{out}-$ 225 will begin to change. The time required for the voltages on the input of the hold stages to fall out of common mode range depends on the magnitude of the leakage currents.

Figure 9:
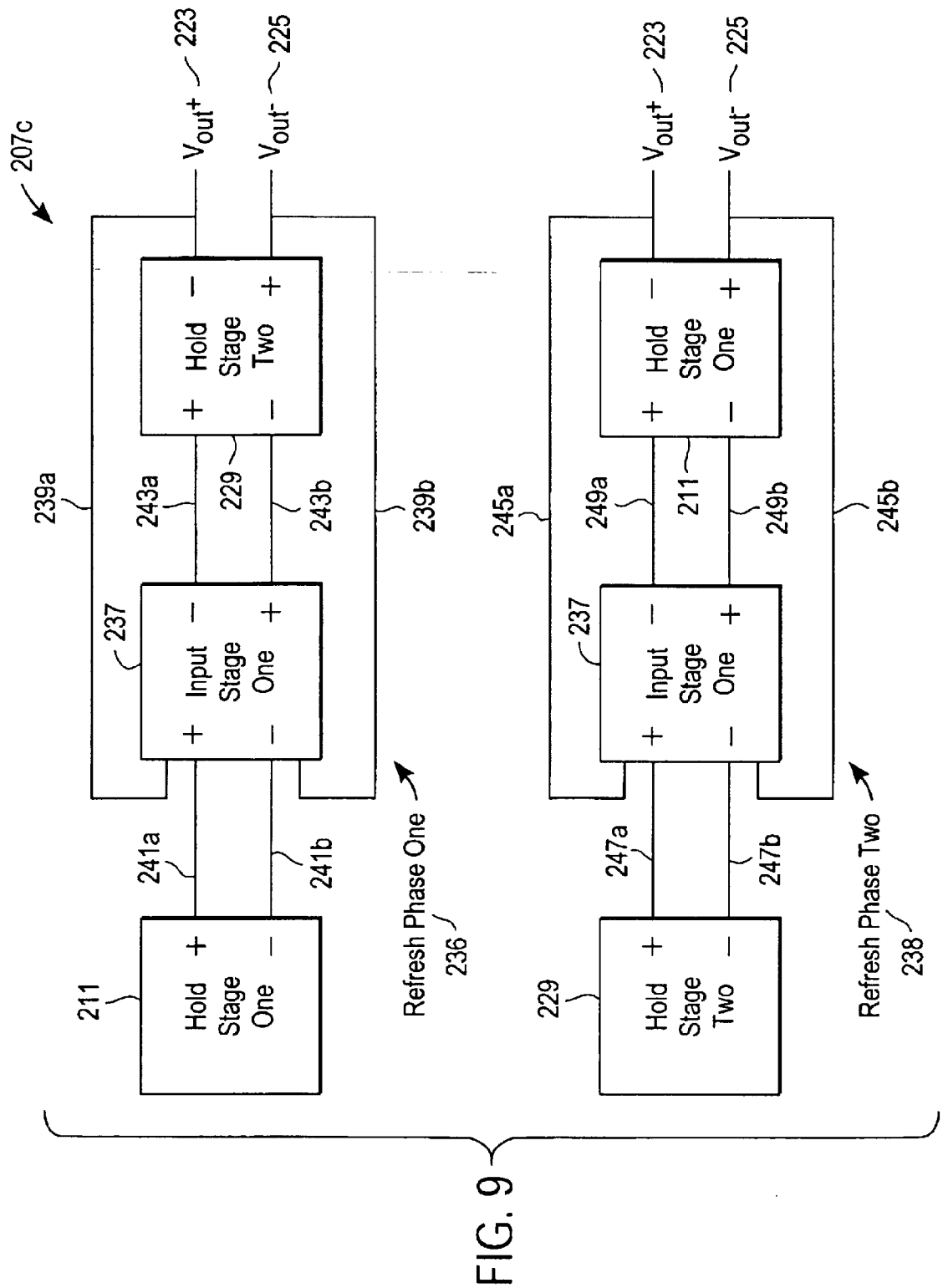
FIG. 9 is an illustration showing a hold cell in a refresh mode of operation in accordance with one embodiment of the present invention.

Rather than require the host device to return to normal operation when the voltages on the input of the hold stages fall out of common mode range, a preferred embodiment of the present invention incorporates a transition from the hold mode of operation 207b to a refresh mode of operation 207c. This transition occurs when the voltages on the input of the hold stages reach a preset refresh threshold level. Thus, before the voltages on the input of the hold stages drop out of common mode range, the refresh mode of operation 207c is initiated. FIG. 9 shows the hold cell 207 in the refresh mode of operation 207c, in accordance with a preferred embodiment of the present invention. The refresh mode of operation 207c includes a refresh phase one 236 and a refresh phase two 238.

Refresh phase one 236 includes the hold stage one 211 connected in a cross-coupled manner to input stage one 237 through a connection 241a and a connection 241b. Input stage one 237 is in turn connected to hold stage two 229 through a connection 243a and a connection 243b. Feedback is provided from hold stage two 229 to input stage one 237 through a connection 239a and a connection 239b. The output voltages $V_{out}+$ 223 and $V_{out}-$ 225 are obtained from hold stage two 229 through connections 239a and 239b, respectively.

Refresh phase two 238 includes the hold stage two 229 connected in a cross-coupled manner to input stage one 237 through a connection 247a and a connection 247b. Input stage one 237 is in turn connected to hold stage one 211 through a connection 249a and a connection 249b. Feedback is provided from hold stage one 211 to input stage one 237 through a connection 245a and a connection 245b. The output voltages $V_{out}+$ 223 and $V_{out}-$ 225 are obtained from hold stage one 211 through connections 245a and 245b, respectively.

When entering the refresh mode of operation 207c from the hold mode of operation 207b, refresh phase one 236 is performed. In refresh phase one 236, the hold stage one 211 voltage is sent to input stage one 237 and is then loaded onto hold stage two 229. In refresh phase one 236; input stage one 237 is connected as a voltage follower such that the hold stage one 211 signals will be copied directly onto hold stage two 229. Upon completion of refresh phase one 236, hold stage two 229 is disconnected from input stage one 237, and the VCO 145 differential input voltage V is obtained from the hold stage two 229 output voltages $V_{out}+$ 223 and $V_{out}-$ 225. If the common mode voltage of hold stage two 229 moves to within a preset distance from the boundary of the common mode range, refresh phase two 238 will be performed. In the transition from refresh phase one 236 to refresh phase two 238, the polarities of hold stage one 211 and hold stage two 229 are reversed. In a manner similar to refresh phase one 236, the hold stage two 229 voltage is sent to input stage one 237 and then loaded onto hold stage one 211. However, in refresh phase two 238, input stage one 237 is connected as a typical differential amplifier. The differential amplifier incorporates a common mode rejection feature. Thus, when refresh phase two 238 is performed, the common mode signal on hold stage two 229 is cancelled by the common mode rejection feature of input stage one 237. At initiation of refresh phase two 238, the common mode signal present on hold stage two 229 includes the common mode signal accumulated since the initiation of the hold mode of operation 207b. Therefore, cancellation of the common mode signal on hold stage two 229 during refresh phase two 238 results in a return of the absolute voltages on hold stage one 211 to the absolute voltages at the initiation of the hold mode of operation 207b. Upon completion of refresh phase two 238, hold stage one 211 is disconnected from input stage one 237, and the VCO 145 differential input voltage V is obtained from the hold stage one 211 output voltages $V_{out}+$ 223 and $V_{out}-$ 225. If the common mode voltage of hold stage one 211 moves to within a preset distance from the boundary of the common mode range, refresh phase one 236 will be re-performed. In the transition from refresh phase two 238 to refresh phase one 236, the polarities of hold stage one 211 and hold stage two 229 are reversed. In the aforementioned manner, the hold cell 207 circuit flips back-and-forth between refresh phase one 236 and refresh phase two 238 while in the refresh mode of operation 207c.

A correlated double sampling technique is used to mitigate DC offsets introduced during the refresh mode of operation 207c. Consider that when refresh phase one 236 copies the voltage from hold stage one 211 onto hold stage two 229, the voltage resulting on hold stage two 229 is equal to the voltage on hold stage one 211 plus any DC offset that is introduced by input stage one 237. When the voltages of the hold stages are copied onto one another, the DC offset present in the receiving hold stage will be approximately equal in magnitude but opposite in polarity to the DC offset being introduced by the input stage 237. Therefore, the DC offset present on the receiving hold stage will be cancelled by the DC offset introduced by the input stage 237. This DC offset canceling effect is the primary benefit gained from incorporating the correlated double sampling technique. Double sampling in opposite polarity, as performed in the sampling mode of operation 207a, allows the correlated double sampling technique to be effective when entering the refresh mode of operation 207c.

The refresh mode of operation 207c continues until the host device wakes up from sleep mode and returns to normal operation, at which time the hold cell will revert back to the sampling mode of operation 207a. The maximum duration for the refresh mode of operation 207c may be limited by the buildup of small DC offsets that escape the correlated double sampling technique. The escape of these small DC offsets is typically due to leakage current imbalances within the input stages. If the small DC offsets accumulate to the point where the hold stages are out of common mode range, the host device will return to normal operation so that the hold cell can return to the sampling mode of operation 207a and resample the input voltages $V_{in}+$ 215 and $V_{in}-$ 217. In a preferred embodiment of the present invention, the hold cell 207 is capable of supporting a host device sleep mode duration of up to 41 seconds. In another embodiment, the hold cell 207 may be capable of supporting a host device sleep mode duration of more than 41 seconds.

Figure 10:
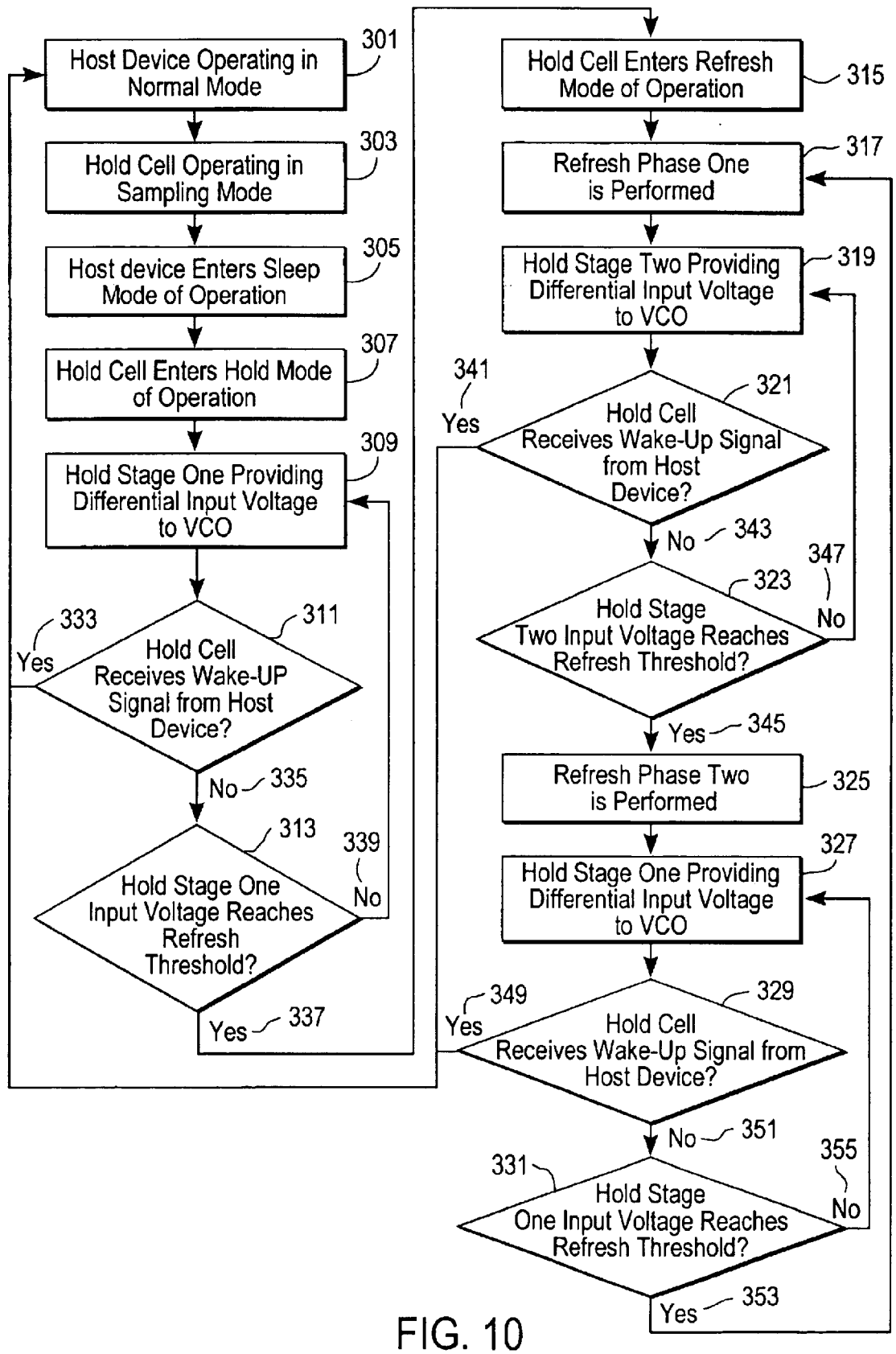
FIG. 10 is a flow chart illustrating a method for operating a hold cell in accordance with one embodiment of the present invention.

FIG. 10 is a flow chart illustrating a method for operating the hold cell 207, in accordance with one embodiment of the present invention. The method begins at a step 301 with the host device operating in normal mode. While the host device is operating in normal mode, the hold cell 207 is operating in sampling mode as indicated by a step 303. In accordance with criteria specific to the particular application, the host device will enter a sleep mode of operation as shown in a step 305. When the host device enters the sleep mode of operation, the hold cell 207 enters the hold mode of operation as shown in a step 307. Upon entering the hold mode of operation, hold stage one 211 of the hold cell 207 provides the differential input voltage V to the VCO 145 as shown in a step 309. While operating in hold mode, the hold cell 207 monitors the host device sleep status as indicated by a step 311. If the hold cell 207 receives a wake-up signal from the host device as indicated by a branch 333, the host device will return to normal operating mode as shown in step 301, and the hold cell 207 will then return to sampling mode as shown in step 303. While the hold cell 207 does not receive a wake-up signal from the host device as indicated by a branch 335, the hold stage one 211 input voltage is monitored as shown in a step 313 to determine if a preset threshold voltage for refresh mode initiation has been reached. If the threshold voltage for refresh mode initiation has not been reached as indicated by a branch 339, hold stage one 211 will continue to provide the differential input voltage V to the VCO 145 as shown in step 309. If the threshold voltage for refresh mode initiation has been reached as indicated by a branch 337, the hold cell 207 will enter the refresh mode of operation as shown in a step 315. In a preferred embodiment of the present invention, steps 311 and 313 are performed simultaneously by the hold cell 207 such that both the host device wake-up signal and the refresh initiation threshold voltage are monitored simultaneously. In another embodiment, the hold cell 207 may perform steps 311 and 313 in an arbitrary order of succession.

When the hold cell 207 enters the refresh mode of operation as shown in step 315, refresh phase one 236 is performed as shown in a step 317. Once refresh phase one 236 is performed, hold stage two 229 provides the differential input voltage V to the VCO 145 as shown in a step 319. The hold cell 207 then monitors the host device sleep status as indicated by a step 321. If the hold cell 207 receives a wake-up signal from the host device as indicated by a branch 341, the host device will return to normal operating mode as shown in step 301, and the hold cell 207 will then return to sampling mode as shown in step 303. While the hold cell 207 does not receive a wake-up signal from the host device as indicated by a branch 343, the hold stage two 229 input voltage is monitored as shown in a step 323 to determine if a preset threshold voltage for refresh phase two 238 initiation has been reached. If the threshold voltage for refresh phase two 238 initiation has not been reached as indicated by a branch 347, hold stage two 229 will continue to provide the differential input voltage V to the VCO 145 as shown in step 319. If the threshold voltage for refresh phase two 238 initiation has been reached as indicated by a branch 345, the hold cell 207 will perform refresh phase two 238 as shown in a step 325. In a preferred embodiment of the present invention, steps 321 and 323 are performed simultaneously by the hold cell 207 such that both the host device wake-up signal and the refresh phase two 238 initiation threshold voltage are monitored simultaneously. In another embodiment, the hold cell 207 may perform steps 321 and 323 in an arbitrary order of succession.

Once refresh phase two 238 is performed, hold stage one 211 provides the differential input voltage V to the VCO 145 as shown in a step 327. The hold cell 207 then monitors the host device sleep status as indicated by a step 329. If the hold cell 207 receives a wake-up signal from the host device as indicated by a branch 349, the host device will return to normal operating mode as shown in step 301, and the hold cell 207 will then return to sampling mode as shown in step 303. While the hold cell 207 does not receive a wake-up signal from the host device as indicated by a branch 351, the hold stage one 211 input voltage is monitored as shown in a step 331 to determine if a preset threshold voltage for refresh phase one 236 initiation has been reached. If the threshold voltage for refresh phase one 236 initiation has not been reached as indicated by a branch 355, hold stage one 211 will continue to provide the differential input voltage V to the VCO 145 as shown in step 327. If the threshold voltage for refresh phase one 236 initiation has been reached as indicated by a branch 353, the hold cell 207 will perform refresh phase one 236 as shown in step 317. In a preferred embodiment of the present invention, steps 329 and 331 are performed simultaneously by the hold cell 207 such that both the host device wake-up signal and the refresh phase one 236 initiation threshold voltage are monitored simultaneously. In another embodiment, the hold cell 207 may perform steps 329 and 331 in an arbitrary order of succession.

Figure 11:
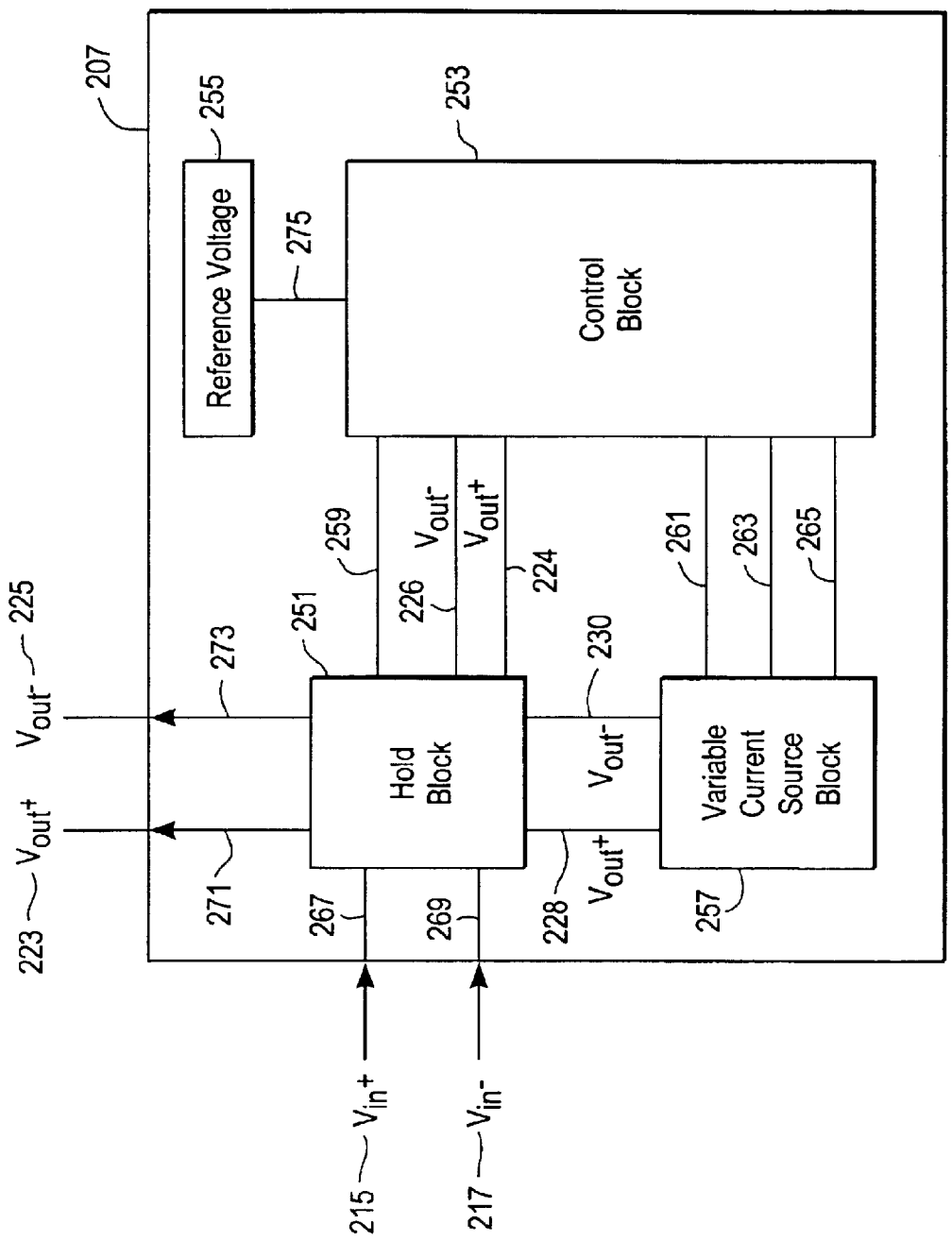
FIG. 11 is an illustration showing a high-level diagram of a hold cell circuit design in accordance with one embodiment of the present invention.

FIG. 11 shows a high-level diagram of the hold cell 207 circuit design, in accordance with one embodiment of the present invention. The hold cell 207 circuit includes a hold block 251, a control block 253, and a variable current source block 257. The hold block 251 samples the voltages $V_{in}+$ 215 and $V_{in}-$ 217 provided by the charge pump 137 through a connection 267 and a connection 269, respectively. The hold block 251 provides as output from the hold cell 207, the voltages $V_{out}+$ 223 and $V_{out}-$ 225 through a connection 271 and a connection 273, respectively. The control block 253 is connected to the $V_{out}+$ 223 and $V_{out}-$ 225 voltages of the hold block 251 by a connection 224 and a connection 226, respectively. A connection 259 exists between hold block 251 and control block 253 for feedback purposes. The variable current source block 257 is connected to the $V_{out}+$ 223 and $V_{out}-$ 225 voltages of the hold block 251 by a connection 228 and a connection 230, respectively. A connection 261, a connection 263, and a connection 265 carry signals between the control block 253 and the variable current source block 257. The control block 253 receives a reference voltage 255 through a connection 275. The control block 253 and variable current source block 257 serve to provide common mode, negative feedback to the hold block 251 such that the common mode voltage associated with $V_{out}+$ 223 and $V_{out}-$ 225 is maintained at essentially the same level as the reference voltage 255.

Figure 12:
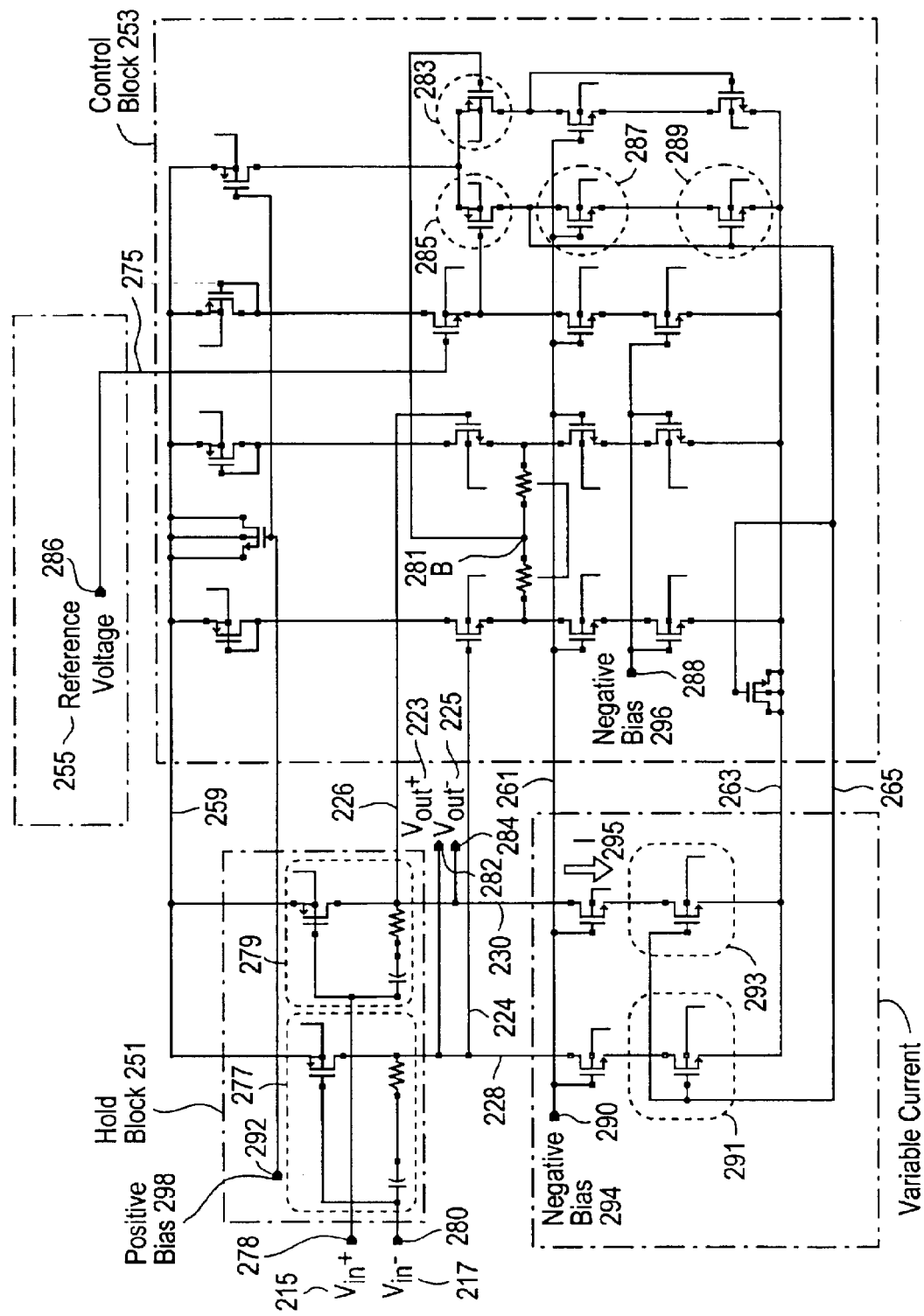
FIG. 12 is an illustration showing a detailed diagram of a hold cell circuit design in accordance with one embodiment of the present invention.

FIG. 12 shows a detailed diagram of the hold cell 207 circuit design, in accordance with one embodiment of the present invention. The detailed diagram of the hold cell 207 shows the circuitry utilized in the hold block 251, the control block 253, and the variable current source block 257 from FIG. 11. Additionally, connections 224, 226, 259, 228, 230, 261, 263, and 265 from FIG. 11 are shown. Also, the reference voltage 255 is passed from a terminal 286 through the connection 275 to the control block 253. The voltages $V_{in}+$ 215 and $V_{in}-$ 217 are provided to the hold block 251 at a terminal 278 and a terminal 280, respectively. The voltages $V_{out}+$ 223 and $V_{out}-$ 225 are received from the hold block 251 at a terminal 282 and a terminal 284, respectively. A negative bias 294 is supplied to the variable current source block 257 and the control block 253 at a terminal 290. A negative bias 296 is supplied to the control block 253 at a terminal 288. A positive bias 298 is supplied to the control block at a terminal 292.

When the hold cell 207 enters the hold mode of operation 207b, a switch at terminal 278 and a switch at terminal 280 open. These switches are typically non-ideal resulting in a leakage current flow through terminal 278 and terminal 280. This leakage current causes the input voltages $V_{in}+$ 215 and $V_{in}-$ 217 to drop. As the input voltages $V_{in}+$ 215 and $V_{in}-$ 217 drop, a PMOS device 277 and a PMOS device 279 turn on. The net result of the PMOS devices 277 and 279 turning on is that the output voltages $V_{out}+$ 223 and $V_{out}-$ 225 are pulled up. The refresh rate of the hold cell 207 is set so that the output voltages $V_{out}+$ 223 and $V_{out}-$ 225 are prevented from rising to the supply voltage. As the output voltages $V_{out}+$ 223 and $V_{out}-$ 225 begin to rise, the associated common mode voltage at a node B 281 also begins to rise. The common mode voltage at node B 281 is compared to the reference voltage 255 through a differential pair formed by a transistor 283 and a transistor 285. As the common mode voltage at node B 281 begins to rise relative to the reference voltage 255, the transistor 283 begins to turn off and the transistor 285 begins to turn on. When transistor 285 turns on, more current flows through a transistor 287 and a transistor 289. The transistor 289 in the control block 253 is mirrored by a transistor 291 and a transistor 293 in the variable current source block 257. Thus, as more current flows through the transistor 289, more current also flows through the transistors 291 and 293. The result is an increase in a current I 295 flowing through the variable current source block 257 which serves to pull the output voltages $V_{out}+$ 223 and $V_{out}-$ 225 back down. Basically, the control block 253 controls the current in the variable current source block 257 such that the output voltages $V_{out}+$ 223 and $V_{out}-$ 225 provided by hold block 251 remain essentially constant. The hold cell 207 operating in the aforementioned manner may be characterized as a closed-loop, negative feedback circuit with the negative feedback control based on the common mode output voltage of the hold block 251.

Figure 13:
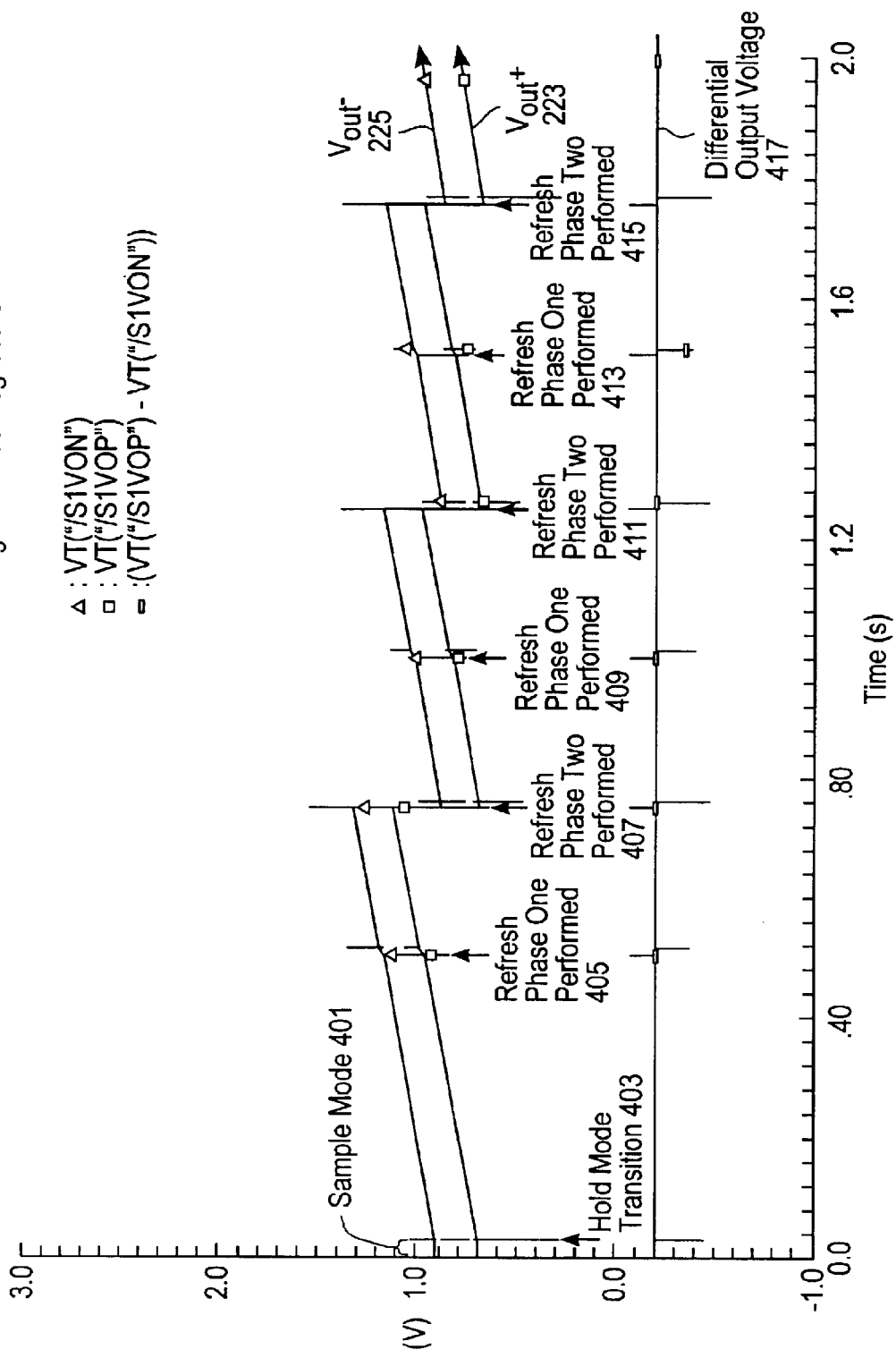
FIG. 13 is an illustration showing an exemplary simulation of a hold cell operating at 100° C. in accordance with a preferred embodiment of the present invention.

FIG. 13 shows an exemplary simulation of the hold cell 207 operating at 100° C., in accordance with a preferred embodiment of the present invention. The simulation results correspond to the hold cell 207 incorporating closed-loop, common mode negative feedback as previously described. As previously mentioned, the hold cell 207 in the exemplary simulation of FIG. 13 is operating at a temperature of 100° C. At this high temperature, leakage currents are severe. The input voltages $V_{in}+$ 215 and $V_{in}-$ 217 are 0.7 V and −0.9 V, respectively, with the corresponding differential input voltage equal to −0.2 V. The temperature and input voltages used in the simulation were arbitrarily selected. In a preferred embodiment, the hold cell 207 will be capable of operating over a maximum temperature range and a maximum voltage range specific to implementation in the host device. The top two curves in FIG. 13 represent the output voltages $V_{out}-$ 225 and $V_{out}+$ 223, respectively. The bottom curve represents a differential output voltage 417 provided by the hold cell 207. In actual implementation, the differential output voltage 417 would serve as the differential input voltage V to the VCO 145.

The exemplary simulation shown in FIG. 13 begins with the hold cell 207 operating in the sampling mode of operation 207a as indicated by a range 401. Recall that in the sampling mode of operation 207a the input voltages $V_{in}+$ 215 and $V_{in}-$ 217 are sampled from the charge pump 137 output. A transition 403 indicates where the hold cell 207 switches from the sampling mode of operation 207a to the hold mode of operation 207b. While in hold mode, the output voltages $V_{out}+$ 223 and $V_{out}-$ 225 rise steadily. However, the common mode negative feedback feature incorporated in the hold cell 207 design ensures that the output voltages $V_{out}+$ 223 and $V_{out}-$ 225 rise in a common mode manner such that the differential output voltage 417 remains substantially constant. A transition 405 indicates where the hold cell 207 switches from the hold mode of operation 207b to the refresh mode of operation. At transition 405, refresh phase one 236 is performed. As demonstrated, the signals from hold stage one 211 are copied directly to hold stage two 229 during refresh phase one 236. A transition 407 indicates where the hold cell 207 performs refresh phase two 238. As demonstrated, due to the common mode rejection of input stage one 237 in refresh phase two 238, the absolute voltages $V_{out}+$ 223 and $V_{out}-$ 225 return to their original levels. A transition 409 indicates where the hold cell 207 re-performs refresh phase one 236. A transition 411 indicates where the hold cell 207 re-performs refresh phase two 238. As further shown by a transition 413 and a transition 415, the hold cell 207 continues to switch back-and-forth between refresh phase one 236 and refresh phase two 238 while in the refresh mode of operation 207c. Each operational mode transition is marked by a pair of sharp vertical signals that effectively correspond to the opening and closing of switches. The hold cell 207 operates based on a make-before-break principle in which the post-transition switches must be closed prior to opening the pre-transition switches. The make-before-break principle minimizes the charge injection associated with the transition. The primary objective of the hold cell 207 is to maintain an essentially constant differential output voltage that is independent of leakage currents introduced by factors such as non-ideal devices and temperature variations. In the exemplary simulation shown in FIG. 13, the differential output voltage 417 changes by less than 75 $\mu$V (i.e., 75E-6 V). Thus, the differential output voltage 417 remains substantially constant during the hold cell 207 simulation at 100° C.

Figure 14:
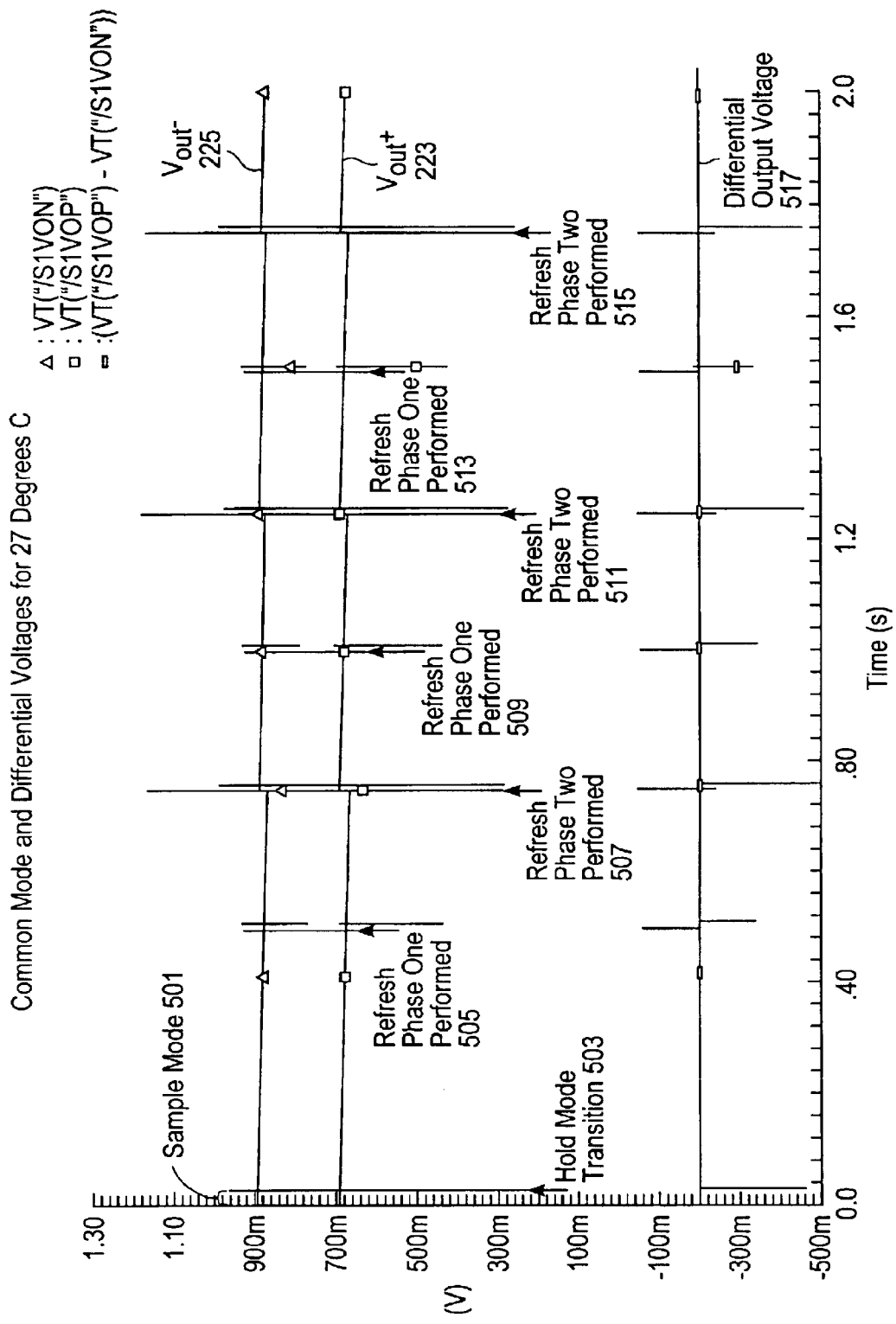
FIG. 14 is an illustration showing an exemplary simulation of a hold cell operating at 27° C. in accordance with a preferred embodiment of the present invention.

FIG. 14 shows an exemplary simulation of the hold cell 207 operating at 27° C., in accordance with a preferred embodiment of the present invention. The simulation shown in FIG. 14 is the same as the simulation shown in FIG. 13 with the exception of temperature. The top two curves in FIG. 14 represent the output voltages $V_{out}-$ 225 and $V_{out}+$ 223, respectively. The bottom curve represents a differential output voltage 517 provided by the hold cell 207. The exemplary simulation shown in FIG. 14 begins with the hold cell 207 operating in the sampling mode of operation 207a as indicated by a range 501. A transition 503 indicates where the hold cell 207 switches from the sampling mode of operation 207a to the hold mode of operation 207b. In contrast to the exemplary simulation shown in FIG. 13, lower leakage currents due to the decreased temperature of 27° C., combined with the hold cell 207 operational characteristics, result in a slight but steady decrease in the output voltages $V_{out}+$ 223 and $V_{out}-$ 225 during hold mode. However, the negative feedback feature incorporated in the hold cell 207 design ensures that the output voltages $V_{out}+$ 223 and $V_{out}-$ 225 decrease in a common mode manner such that the differential output voltage 517 remains substantially constant. A transition 505 indicates where the hold cell 207 switches from the hold mode of operation 207b to the refresh mode of operation. At transition 505, refresh phase one 236 is performed. As demonstrated, the signals from hold stage one 211 are copied directly to hold stage two 229 during refresh phase one 236. A transition 507 indicates where the hold cell 207 performs refresh phase two 238. As demonstrated, due to the common mode rejection of input stage one 237 in refresh phase two 238, the absolute voltages $V_{out}+$ 223 and $V_{out}-$ 225 return to their original levels. A transition 509 indicates where the hold cell 207 re-performs refresh phase one 236. A transition 511 indicates where the hold cell 207 re-performs refresh phase two 238. As further shown by a transition 513 and a transition 515, the hold cell 207 continues to switch back-and-forth between refresh phase one 236 and refresh phase two 238 while in the refresh mode of operation 207c. In the exemplary simulation shown in FIG. 14, the differential output voltage 517 changes by less than 30 $\mu$V (i.e., 30E-6 V). Due to less severe leakage currents at lower temperatures, the change in differential output voltage 517 while operating at 27° C. (i.e., 30 $\mu$V) is less than the corresponding change while operating at 100° C. (i.e., 75 $\mu$V). Thus, the differential output voltage 517 remains substantially constant during the hold cell 207 simulation at 27° C.

Figure 15:
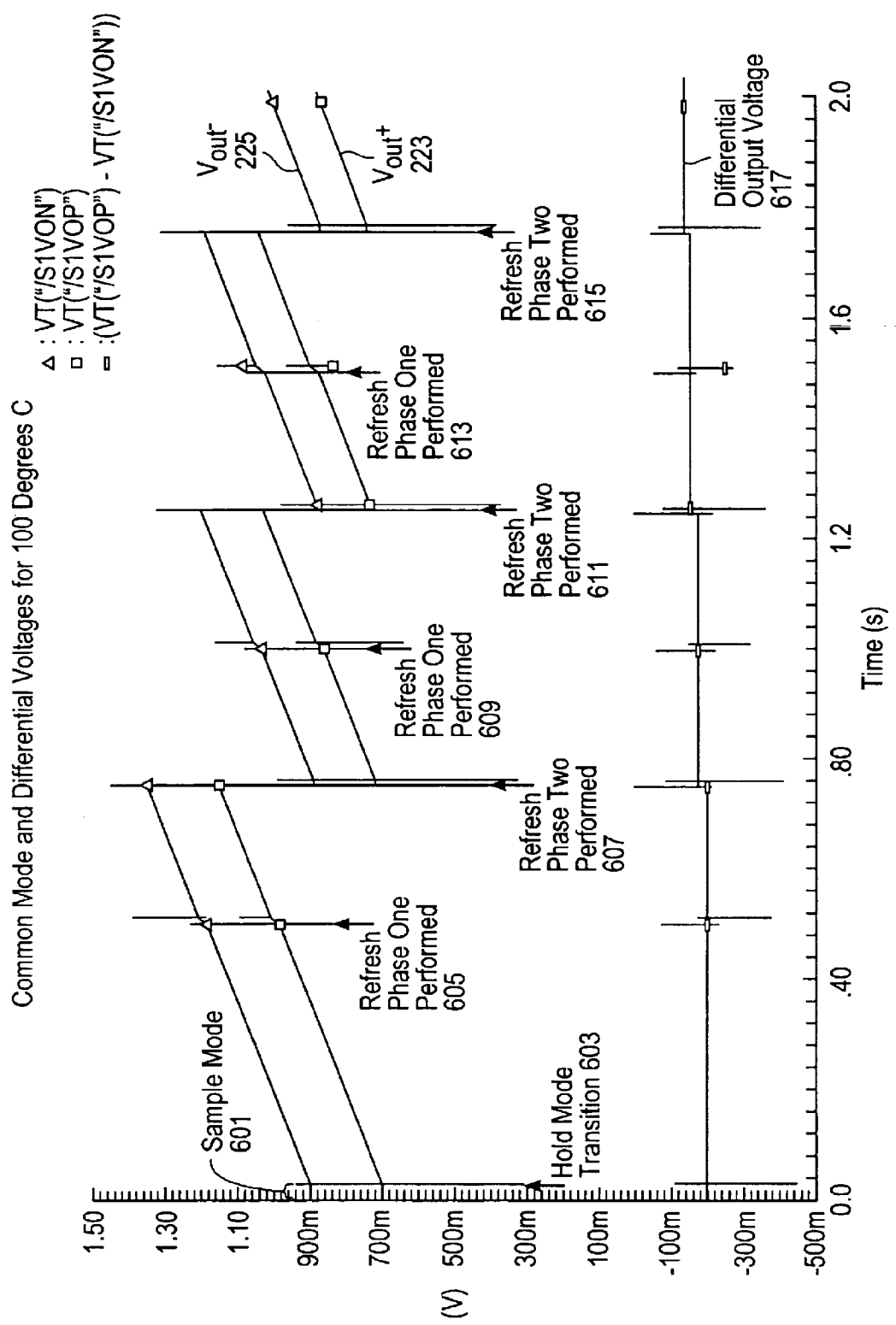
FIG. 15 is an illustration showing an exemplary simulation of a hold cell operating at 100° C. in accordance with an alternate embodiment of the present invention.

FIG. 15 shows an exemplary simulation of the hold cell 207 operating at 100° C., in accordance with an alternate embodiment of the present invention. The simulation results correspond to the hold cell 207 without incorporation of the closed-loop, common mode negative feedback feature. The hold cell 207 in the exemplary simulation of FIG. 15 is operating at a temperature of 100° C. The input voltages $V_{in}+$ 215 and $V_{in}-$ 217 are 0.7 V and −0.9 V, respectively, with the corresponding differential input voltage equal to −0.2 V. The temperature and input voltages used in the simulation were arbitrarily selected. The top two curves in FIG. 15 represent the output voltages $V_{out}-$ 225 and $V_{out}+$ 223, respectively. The bottom curve represents a differential output voltage 617 provided by the hold cell 207.

The exemplary simulation shown in FIG. 15 begins with the hold cell 207 operating in the sampling mode of operation 207a as indicated by a range 601. A transition 603 indicates where the hold cell 207 switches from the sampling mode of operation 207a to the hold mode of operation 207b. While in hold mode, the output voltages $V_{out}$+ 223 and $V_{out}$− 225 rise steadily. A transition 605 indicates where the hold cell 207 switches from the hold mode of operation 207b to the refresh mode of operation. At transition 605, refresh phase one 236 is performed. As demonstrated, the signals from hold stage one 211 are copied directly to hold stage two 229 during refresh phase one 236. A transition 607 indicates where the hold cell 207 performs refresh phase two 238. Without the common mode negative feedback feature, as previously incorporated in a preferred embodiment of the present invention, the common mode rejection of input stage one 237 in refresh phase two 238 does not return the absolute voltages $V_{out}$+ 223 and $V_{out}$− 225 to their original levels. A transition 609 indicates where the hold cell 207 re-performs refresh phase one 236. A transition 611 indicates where the hold cell 207 re-performs refresh phase two 238. As further shown by a transition 613 and a transition 615, the hold cell 207 continues to switch back-and-forth between refresh phase one 236 and refresh phase two 238 while in the refresh mode of operation 207c. In the exemplary simulation shown in FIG. 15, the differential output voltage 617 changes by more than 80 mV (i.e., 80E-3 V) during the hold cell 207 simulation at 100° C. In comparison to the hold cell 207 simulation shown in FIG. 13, the change in differential output voltage 617 is more than 1000 times worse than when the common mode negative feedback feature is incorporated. Therefore, in a preferred embodiment of the present invention where the hold cell 207 incorporates the closed-loop, common mode negative feedback method, the differential output voltage (i.e., the differential input voltage V to the VCO 145) may be maintained at a significantly more constant level.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the claimed invention.

What is claimed is:

1. A hold cell, comprising:
    hold circuitry providing a pair of output voltages, the hold circuitry configured to receive a positive input voltage and a negative input voltage prior to entering a hold mode of operation, the hold circuitry further configured to provide the pair of output voltages in an absence of the positive input voltage and the negative input voltage following entry of the hold mode of operation;
    control circuitry in electrical communication with the hold circuitry, the control circuitry configured to receive the pair of output voltages from the hold circuitry, the control circuitry being further configured to generate a feedback signal during the hold mode of operation, the feedback signal being based on comparison of a common mode voltage and a reference voltage, wherein the common mode voltage is derived from the pair of output voltages; and
    variable current source circuitry defined to be in electrical communication with the control circuitry and the hold circuitry, the variable current source circuitry configured to receive the feedback signal from the control circuitry, the variable current source circuitry being further configured to provide a current to the hold circuitry based on the received feedback signal during the hold mode of operation, the current being defined to minimize a difference between the common mode voltage and the reference voltage.

2. A hold cell as recited in claim 1, wherein the hold circuitry is configured to derive a differential input voltage from the positive input voltage and the negative input voltage prior to entering the hold mode of operation, the hold circuitry being configured to operate during the hold mode of operation based on the differential input voltage, the hold circuitry configured to provide a positive output voltage and a negative output voltage as outputs during the hold mode of operation, the positive output voltage and the negative output voltage defining the pair of output voltages used by the control circuitry to derive the common mode voltage.

3. A hold cell as recited in claim 2, wherein the control circuitry is configured to compare the common mode voltage to the reference voltage to identify a difference between the common mode voltage and the reference voltage, the control circuitry being further configured to use the difference to generate the feedback signal sent from the control circuitry to the variable current source circuitry.

4. A hold cell as recited in claim 3, wherein the current to be provided from the variable current source circuitry to the hold circuitry is to be used to adjust the pair of output voltages provided by the hold circuitry to negate the difference between the common mode voltage and the reference voltage.

5. A method for providing a substantially constant differential voltage, comprising:
    (a) storing a pair of voltages on each of a first hold stage and a second hold stage, the pair of voltages stored on the second hold stage having opposite polarity with respect to the pair of voltages stored on the first hold stage;
    (b) generating a differential output voltage from the first hold stage;
    (c) refreshing the pair of voltages stored on the second hold stage with the pair of voltages stored on the first hold stage, the pair of voltages stored on the second hold stage generating a differential output voltage used to replace the differential output voltage generated from the first hold stage;
    (d) refreshing the pair of voltages stored on the first hold stage with the pair of voltages stored on the second hold stage, the pair of voltages stored on the first hold stage generating a differential output voltage used to replace the differential output voltage generated from the second hold stage; and
    (e) repeating operations (c)–(d) until a signal requires a return to operation (a), wherein the generated differential output voltage from each of the first hold stage and the second hold stage remains substantially constant,
    wherein refreshing the pair of voltages in operations (c) and (d) while the pair of voltages being stored on the first hold stage and the second hold stage are in opposite polarity serves to implement a correlated double sampling technique for mitigating direct current (DC) offsets.

6. A method for providing a substantially constant differential voltage as recited in claim 5, wherein operation (a) is performed using a first sampling stage and a second sampling stage, wherein:

the first sampling stage includes a first input stage and a first hold stage;

the second sampling stage includes a second input stage and a second hold stage;

the first input stage being the same as the second input stage; and the first hold stage being the same as the second hold stage.

7. A method for providing a substantially constant differential voltage as recited in claim 6, wherein the first input stage and the second input stage are both transconductance amplifiers or operational amplifiers while the first hold stage and the second hold stage are both capacitors.

8. A method for providing a substantially constant differential voltage as recited in claim 5, wherein operation (b) an input to the first hold stage and an input to the second hold stage are disconnected.

9. A method for providing a substantially constant differential voltage as recited in claim 5, wherein operation (c) is performed using a first refresh phase in which the first hold stage is in cross-coupled electrical communication with a first input stage, the first input stage is in electrical communication with the second hold stage, an output voltage from the first hold stage is passed through the first input stage to the second hold stage.

10. A method for providing a substantially constant differential voltage as recited in claim 5, wherein operation (d) is performed using a second refresh phase in which the second hold stage is in electrical communication with a first input stage, the first input stage is in electrical communication with the first hold stage, an output voltage from the second hold stage is passed through the first input stage to the first hold stage.

11. A method for providing a substantially constant differential voltage as recited in claim 5, wherein subsequent to the initial completion of operation (c) the voltage polarities corresponding to the first hold stage and the second hold stage are each reversed prior to performing operation (c) or operation (d).

12. A method for providing a substantially constant differential voltage as recited in claim 5, wherein the performance of either operation (b), (c), or (d) stops and the performance of the subsequent operation begins upon reaching a threshold voltage on an input to either the first hold stage that is generating the differential output voltage.

13. A method for providing a substantially constant differential voltage as recited in claim 5, wherein receipt of a signal from a host device causes the performance of operation (b), (c), (d), or (e) to stop and causes the performance of operation (a) to begin.

* * * * *